United States Patent
Lee et al.

(10) Patent No.: US 11,670,568 B2
(45) Date of Patent: Jun. 6, 2023

(54) SEMICONDUCTOR DEVICE AND SEMICONDUCTOR PACKAGE HAVING THE SAME

(71) Applicant: Samsung Electronics Co., Ltd., Suwon-si (KR)

(72) Inventors: Seonho Lee, Cheonan-si (KR); Jinsu Kim, Seoul (KR); Junwoo Myung, Cheonan-si (KR); Yongjin Park, Yongin-si (KR); Jaekul Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 207 days.

(21) Appl. No.: 17/029,334

(22) Filed: Sep. 23, 2020

(65) Prior Publication Data
US 2021/0193555 A1    Jun. 24, 2021

(30) Foreign Application Priority Data

Dec. 19, 2019    (KR) .......................... 10-2019-0170815

(51) Int. Cl.
*H01L 23/373*    (2006.01)
*H01L 23/498*    (2006.01)
(Continued)

(52) U.S. Cl.
CPC ........ *H01L 23/3735* (2013.01); *H01L 23/053* (2013.01); *H01L 23/3128* (2013.01); *H01L 23/49822* (2013.01)

(58) Field of Classification Search
CPC ..... H01L 21/561; H01L 23/053; H01L 23/31; H01L 23/367; H01L 23/3672;
(Continued)

(56) References Cited

U.S. PATENT DOCUMENTS 9,892,994 B2    2/2018    Scurati et al.
9,953,957 B2    4/2018    Gao et al.
(Continued)

FOREIGN PATENT DOCUMENTS

KR    20140145870 A    *    12/2014    ............. B32B 9/048

OTHER PUBLICATIONS

Youhan Sohn, et al. "Effects of shape and alignment of reinforcing graphite phases on the thermal conductivity and the coefficient of thermal expansion of graphite/copper composites", Department of Materials Science and Engineering, Chungnam National University, dated Nov. 2018.
(Continued)

*Primary Examiner* — Karen Kusumakar
*Assistant Examiner* — Adam S Bowen
(74) *Attorney, Agent, or Firm* — Harness, Dickey & Pierce, P.L.C.

(57) ABSTRACT

A semiconductor device including a semiconductor chip having a first surface and a second surface opposite to the first surface, a first heat dissipation member on the second surface of the semiconductor chip, the first heat dissipation member having a vertical thermal conductivity in a direction perpendicular to the second surface, and a horizontal thermal conductivity in a direction parallel to the second surface, the first vertical thermal conductivity being smaller than the first horizontal thermal conductivity, and a second heat dissipation member comprising a vertical pattern penetrating the first heat dissipation member, the second heat dissipation member having a vertical thermal conductivity that is greater than the vertical thermal conductivity of the first heat dissipation member may be provided.

18 Claims, 14 Drawing Sheets

(51) Int. Cl.
*H01L 23/053* (2006.01)
*H01L 23/31* (2006.01)

(58) Field of Classification Search
CPC ............... H01L 23/373; H01L 23/3731; H01L 23/3733; H01L 23/3735; H01L 23/3736; H01L 23/481; H01L 23/49822; H01L 23/525; H01L 23/3128; H01L 23/3677; H01L 23/5383; H01L 23/5384; H01L 24/19; H01L 23/13; H01L 23/3114; H01L 23/5389; H01L 24/16; H01L 24/32; H01L 24/48; H01L 24/73; H01L 2224/0401; H01L 2224/04042; H01L 2224/04105; H01L 2224/12105; H01L 2224/16227; H01L 2224/2518; H01L 2224/32225; H01L 2224/48227; H01L 2224/73265; H01L 2924/15311; H01L 2924/18161
See application file for complete search history.

(56) References Cited

U.S. PATENT DOCUMENTS

| | | | |
|---|---|---|---|
| 2003/0174031 A1* | 9/2003 | Ali | H01L 23/373 |
| | | | 257/E23.11 |
| 2009/0255660 A1* | 10/2009 | Cornie | F28F 13/14 |
| | | | 165/185 |
| 2017/0154878 A1 | 6/2017 | Kim et al. | |
| 2017/0194300 A1 | 7/2017 | Lin et al. | |
| 2017/0243803 A1 | 8/2017 | Lin et al. | |
| 2019/0096791 A1 | 3/2019 | Jeng et al. | |
| 2019/0237410 A1 | 8/2019 | Kim et al. | |
| 2019/0323785 A1* | 10/2019 | Eid | H01L 23/3735 |

OTHER PUBLICATIONS

Izabela Firkowska, et al. "the Origin of High Thermal Conductivity and Ultralow Thermal Expansion in Copper-Graphite Composites", Department of Physics, Freie Universität, dated Aug. 2019.

* cited by examiner

VI-VI'

XB-XB'

XIB-XIB'

SEMICONDUCTOR DEVICE AND SEMICONDUCTOR PACKAGE HAVING THE SAME

CROSS-REFERENCE TO RELATED APPLICATIONS

This application claims priority under 35 U.S.C. § 119 to Korean Patent Application No. 10-2019-0170815 filed on Dec. 19, 2019 in the Korean Intellectual Property Office, the disclosure of which is incorporated herein by reference in its entirety.

TECHNICAL FIELD

The present disclosure relates to semiconductor devices and/or semiconductor packages having the same.

BACKGROUND

As semiconductor devices, such as mobile terminals, are becoming highly integrated and multi-functionalized, and power consumption thereof increases, heat dissipation capability of semiconductor devices has recently become important. Meanwhile, there is a space limitation for heat dissipation in a highly integrated semiconductor device, and accordingly, there is need for a semiconductor package technology capable of efficiently dissipating heat and utilizing space to be suitable for high integration.

SUMMARY

Some example embodiments may provide semiconductor devices and/or semiconductor packages having improved heat dissipation characteristics.

Some example embodiments may provide methods of manufacturing a semiconductor package having improved heat dissipation characteristics.

According to an example embodiment, a semiconductor device includes a semiconductor chip having a first surface and a second surface opposite to the first surface, a first heat dissipation member on the second surface of the semiconductor chip, the first heat dissipation member having a first vertical thermal conductivity in a direction perpendicular to the second surface and a first horizontal thermal conductivity in a direction parallel to the second surface, the first vertical thermal conductivity being smaller than the first horizontal thermal conductivity, and a second heat dissipation member comprising a vertical pattern penetrating the first heat dissipation member, the second heat dissipation member having a second vertical thermal conductivity that is greater than the first vertical thermal conductivity of the first heat dissipation member.

According to an example embodiment, a semiconductor device includes a semiconductor chip comprising a first surface on which a connection pad is disposed and a second surface opposite to the first surface, and a composite heat dissipating layer comprising a graphite sheet on the second surface of the semiconductor chip and a plurality of metal patterns penetrating the graphite sheet.

According to an example embodiment, a semiconductor package includes a package substrate comprising a redistribution layer, a semiconductor chip on the package substrate, the semiconductor chip comprising a first surface and a second surface, the first surface comprising a connection pad electrically connected to the redistribution layer, and the second surface being opposite to the first surface, a composite heat dissipating layer comprising a first heat dissipating sheet and a vertical pattern, the first heat dissipating sheet on the second surface of the semiconductor chip, the first heat dissipating sheet having a first vertical thermal conductivity in a direction perpendicular to the second surface and a first horizontal thermal conductivity in a direction parallel to the second surface, the first vertical thermal conductivity being smaller than the first horizontal thermal conductivity, the vertical pattern penetrating the first heat dissipation sheet, and the vertical pattern having a second vertical thermal conductivity that is greater than the first vertical thermal conductivity of the first heat dissipation sheet, and a sealing member on the package substrate and covering the semiconductor chip.

According to an example embodiment, a method of manufacturing a semiconductor device includes preparing a wafer having a plurality of semiconductor chips, forming a mask pattern in a second region of one surface of the wafer such that a first region of the one surface of the wafer is exposed, forming a first heat dissipation sheet in the first region of the one surface of the wafer, the first heat dissipation sheet having a first vertical thermal conductivity in a through-plane direction perpendicular to the one surface and a first horizontal thermal conductivity in an in-plane direction horizontally parallel to the one surface, the first vertical thermal conductivity being smaller than the first horizontal thermal conductivity, forming a pinhole on the first heat dissipation sheet by removing the mask pattern such that the second region of the wafer is exposed, forming a vertical pattern in the pinhole of the first heat dissipation sheet, the vertical pattern having a second vertical thermal conductivity that is greater than the first vertical thermal conductivity of the first heat dissipation sheet, and cutting the wafer into a plurality of the semiconductor chips together with the first heat dissipation sheet on which the vertical pattern is formed.

BRIEF DESCRIPTION OF DRAWINGS

The above and other aspects, features, and advantages of the present disclosure will be more clearly understood from the following detailed description, taken in conjunction with the accompanying drawings, in which.

Figure 10A:
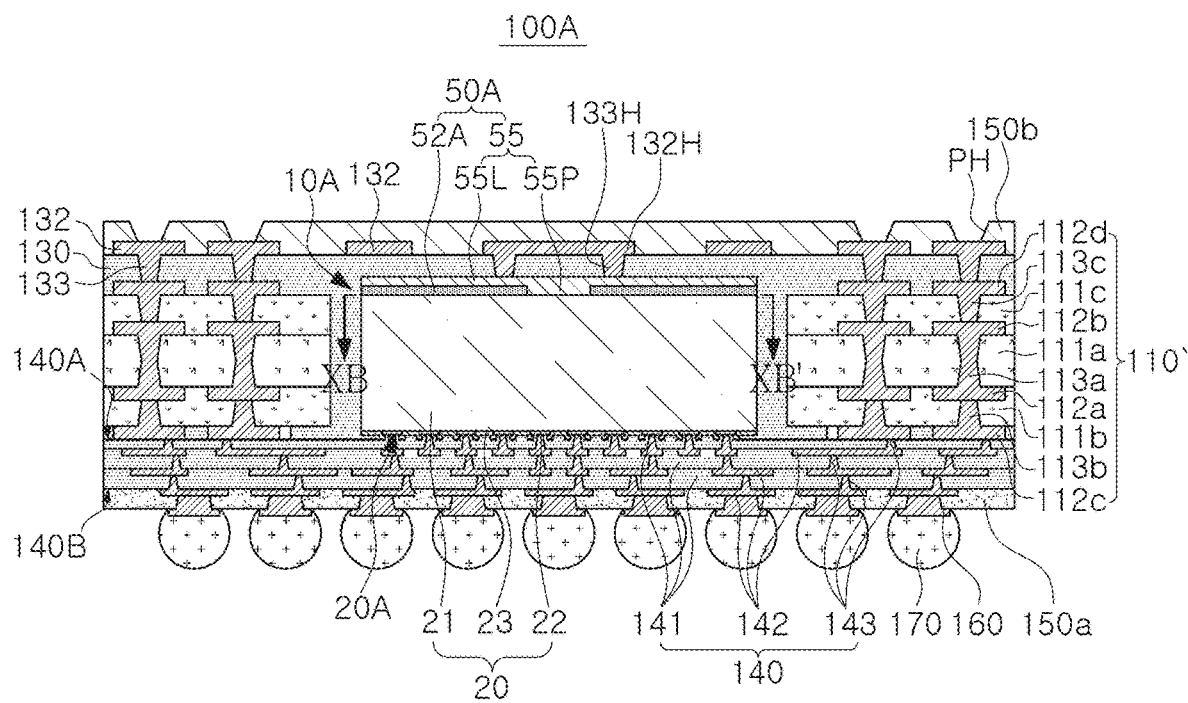
FIG. 10A is a side cross-sectional view of a semiconductor package according to an example embodiment, and FIG.
Figure 11A:
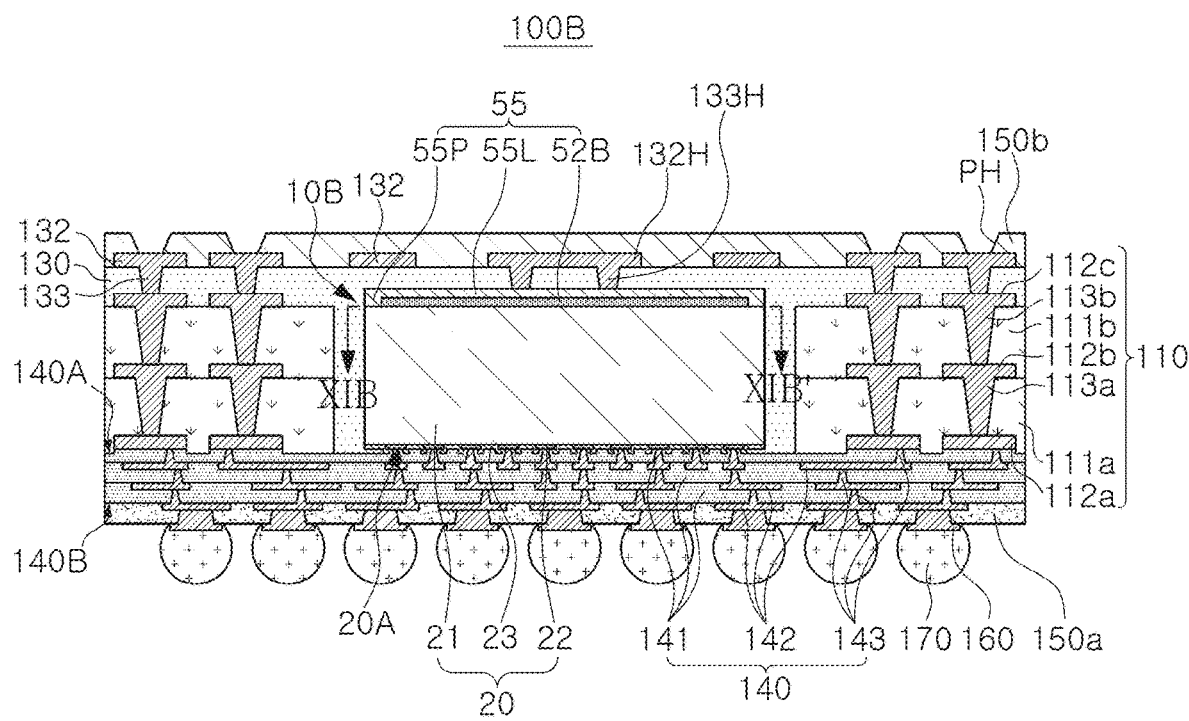
Figure 11B:
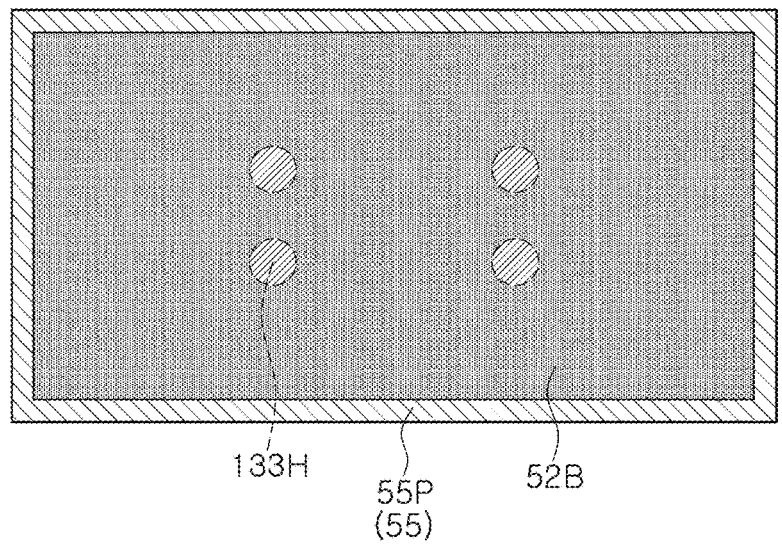
Figure 16A:
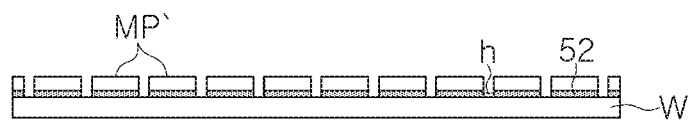
Figure 16B:
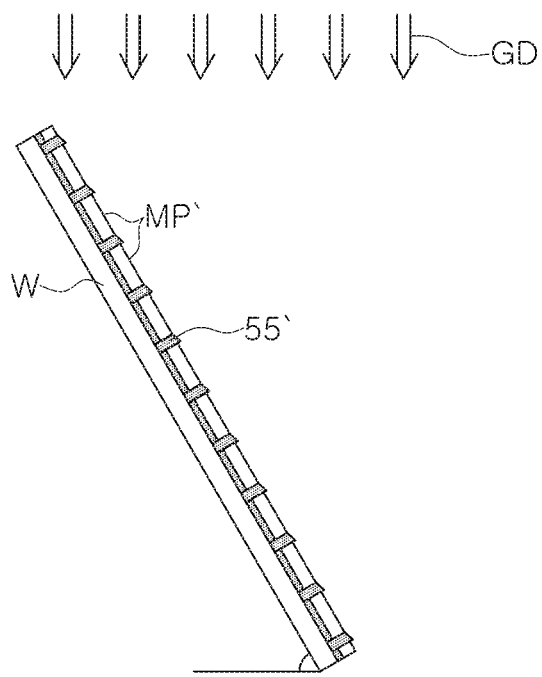
Figure 16C:
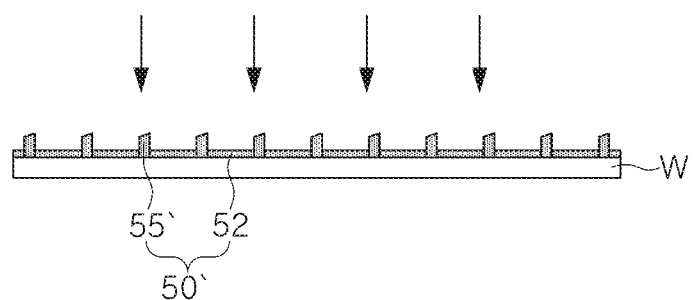
Figure 17:
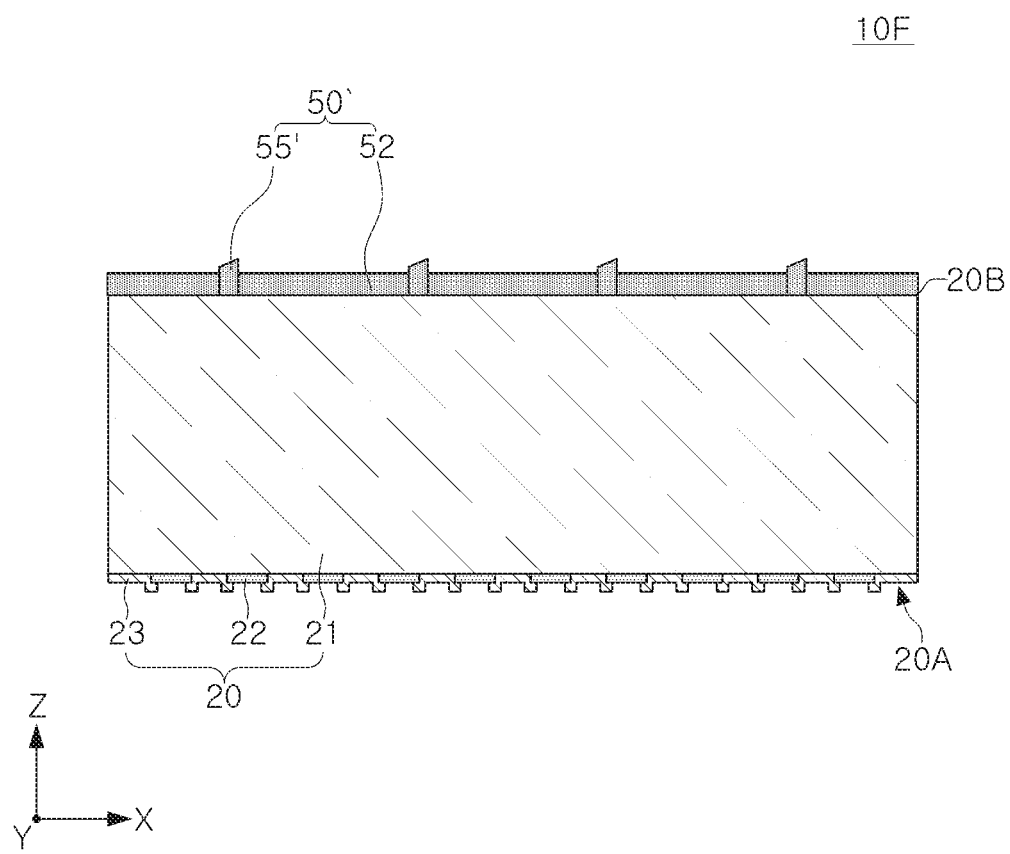

10B is a planar view of a composite heat dissipating layer taken along line XB-XB' of the semiconductor package of FIG. 10A;

FIG. 11A is a side cross-sectional view of a semiconductor package according to an example embodiment, and FIG. 11B is a planar view of the semiconductor package of FIG. 11A taken along line XIB-XIB';

FIGS. 12 to 15 are side cross-sectional views of various examples of semiconductor packages according to some example embodiments;

FIGS. 16A to 16C are side cross-sectional views illustrating a method of manufacturing a semiconductor device according to an example embodiment; and FIG. 17 is a side cross-sectional view of a semiconductor device according to an example embodiment.

DETAILED DESCRIPTION

Hereinafter, example embodiment s of the present disclosure will be described with reference to the accompanying drawings.

While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
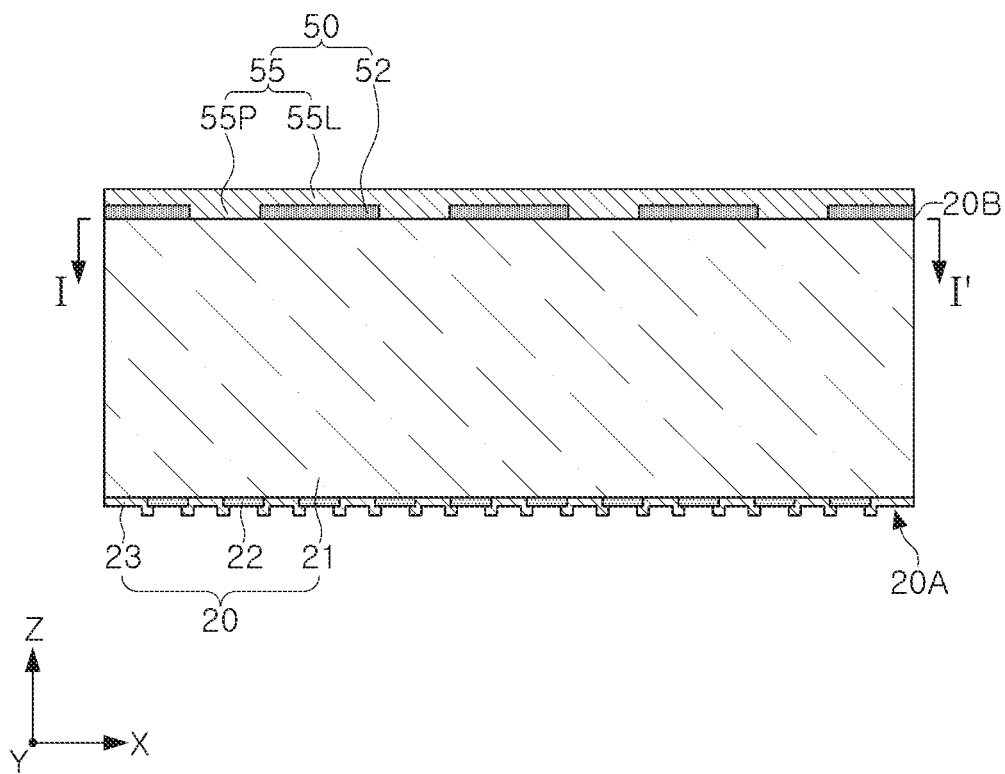
FIG. 1 is a side cross-sectional view of a semiconductor device according to an example embodiment.
Figure 2:
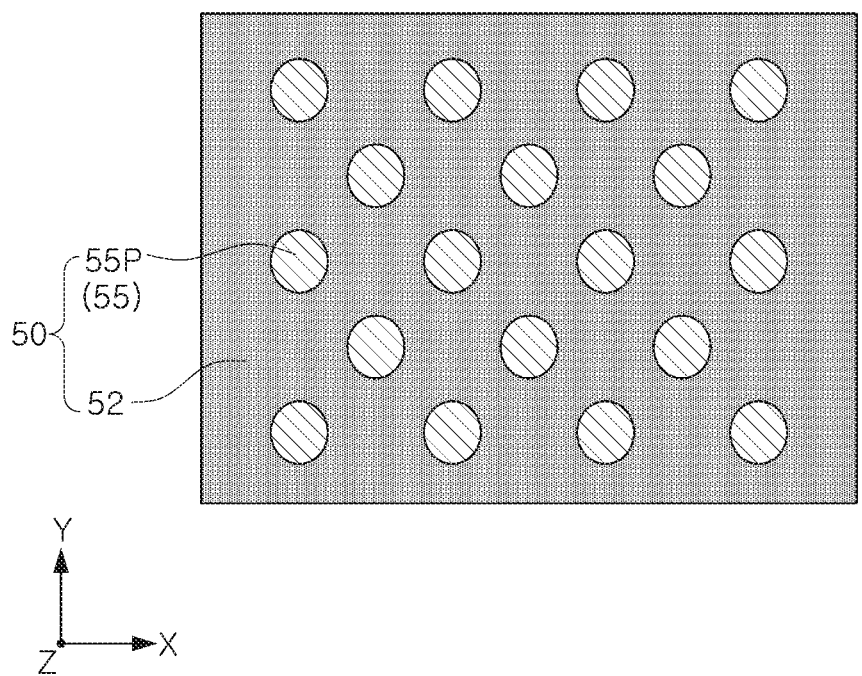
FIG. 2 is a planar view of a composite heat dissipating layer taken along line II-II' of the semiconductor device of FIG. 1.

FIG. 1 is a side cross-sectional view of a semiconductor device according to an example embodiment, and FIG. 2 is a planar view of a composite heat dissipating layer taken along line II-II' of the semiconductor device of FIG. 1.

Based on FIGS. 1 and 2, a semiconductor device 10 according to an example embodiment includes a semiconductor chip 20 having a first surface 20A and a second surface 20B disposed opposite to each other, and a composite heat dissipating layer 50 disposed on the second surface 20B of the semiconductor chip 20.

The semiconductor chip 20 includes a semiconductor substrate 21 having an active surface and a non-active surface oppositely disposed. The active and non-active surfaces correspond to the first and second surfaces 20A and 20B, respectively, of the semiconductor chip. Multiple active/passive elements (e.g., a transistor) and a connection pad connected thereto may be disposed on the active surface of the semiconductor substrate 21. For example, the semiconductor substrate 21 may contain silicon. In another example, the semiconductor substrate 21 may contain a semiconductor atom such as germanium, or a compound semiconductor such as silicon carbide (SiC), gallium arsenide (GaAs), indium arsenide (InAs) and indium phosphide (InP).

A passivation film 23 opening the connection pad 22 may be disposed on the active surface of the semiconductor substrate 21. For example, the passivation film 23 may be an oxide film or a nitride film, or a dual layer thereof.

The semiconductor chip 20 employed in the example embodiment may be, for example, a processor chip such as a central processor (e.g., a central processing unit (CPU)), a graphics processor (e.g., a graphics processing unit (GPU)), a field programmable gate array (FPGA), a digital signal processor, a cryptographic processor, a microprocessor, a microcontroller, or the like, specifically, an application processor (AP), but is not limited thereto. The semiconductor chip 20 may include a memory chip such as a volatile memory (e.g., a dynamic random access memory (DRAM)), a non-volatile memory (for example, a read only memory (ROM)), a flash memory, or the like, a logic chip such as an analog-digital converter, an application-specific integrated circuit (ASIC), or the like, or a power management integrated circuit (PMIC).

The composite heat dissipation layer 50 is disposed on the second surface 20B, that is, the non-active surface, of the semiconductor chip 20, and includes first and second heat dissipation members 52 and 55 having different heat dissipation characteristics from each other.

The first heat dissipation member 52 is in the form of a sheet, and has a heat dissipation characteristics that thermal conductivity (hereinafter, "vertical thermal conductivity" or in-plane thermal conductivity) in a direction perpendicular to the second surface 20B (z direction) lower than thermal conductivity (hereinafter, "horizontal thermal conductivity" or through-plane thermal conductivity) in a direction parallel to the second surface 20B (x-y direction). In the present specification, the first heat dissipation member 52 is also called "heat dissipation sheet." For example, the first heat dissipation member 52 may contain at least one of graphite or graphene.

The second heat dissipation member 55 has a plurality of vertical patterns 55P penetrating the first heat dissipation member 52, and has vertical thermal conductivity higher than that of the first heat dissipation member 52. The second heat dissipation member 55 employed in the present disclosure is disposed on an upper surface of the first heat dissipation member 52 and may further include a heat dissipating layer 55L connecting a plurality of the vertical patterns 55P. The second heat dissipation member 55 may contain a metal having a relatively high thermal conductivity in all directions. For example, copper (Cu), aluminum (Al), silver (Ag), tin (Sn), gold (Au) or nickel (Ni) may be contained.

A material of the second heat dissipation member 55 is not limited thereto. In some example embodiments, a material of the second heat dissipation member 55 may includes a same material as that of the first heat dissipation member 55, that is configured to provide improved thermal conductivity by changing a growth direction thereof (see FIGS. 16A to 16C).

In the example embodiment, the first heat dissipation member 52 guarantee or enable effective heat dissipation in a horizontal direction (x-y direction), but may have inferior thermal conductivity in a vertical direction (z direction). To enhance heat dissipation in the vertical direction (z direction), the vertical patterns 55P penetrating the first heat dissipation member 52 are introduced. Such vertical patterns 55P may be configured to be directly in contact with the second surface 20B of the semiconductor chip 20. In the present example embodiment, the heat dissipating layer 55L of the second heat dissipation member 55 are connected to upper portions of the vertical patterns 55P to more actively or effectively dissipate heat in the vertical direction. As used herein, the term "first heat dissipation member 52" may refer to "first heat dissipation sheet." Likewise, the term "heat dissipating layer 55L" may refer to "second heat dissipation sheet."

In some example embodiments, the first heat dissipation member 52 contain graphite, while the second heat dissipation member 55 may be metal (e.g., Cu). Due to a layer structure, the graphite has vertical thermal conductivity remarkably lower than horizontal thermal conductivity. For example, the horizontal thermal conductivity of the graphite is as high as 1,500 W/m·k to 1,700 W/m·k, whereas the vertical thermal conductivity thereof is merely about 15 W/m·k.

The vertical heat dissipation may be improved by forming the vertical patterns 55P penetrating the first heat dissipation 52 in a thickness direction (i.e., the vertical direction) with a metal. For example, as Cu has thermal conductivity of about 400 W/m·k in all directions, the low vertical thermal conductivity (about 15 W/m·k) of the first heat dissipation member 52 may be improved by the vertical patterns 55P when the second heat dissipation member 55 is formed with Cu.

A side surface of the composite heat dissipating layer 50 employed in the present example embodiment may be substantially coplanar with that of the semiconductor chip 20. Specifically, the side surface of the first heat dissipation member 52 and that of the heat dissipating layer 55L of the second heat dissipation member 55 may be substantially coplanar with that of the semiconductor chip 20. Such coplanar arrangement may be understood as a result obtained by a manufacturing method of the composite heat dissipating layer 50 (see FIGS. 7A to 7D).

A surface area of the second heat dissipation member 55 (e.g., the vertical patterns 55P) may be in contact with the second surface 20B of the semiconductor chip 20, and may account for 1% to 50% of a total surface area of the second surface 20B.

As illustrated in FIG. 2, the vertical patterns 55P of the second heat dissipation member 55 have a circular shape in a plan view and may be arranged to have a constant distance from each other. Although not limited, the vertical patterns 55P may have various shapes and arrangements.

Figure 3A:
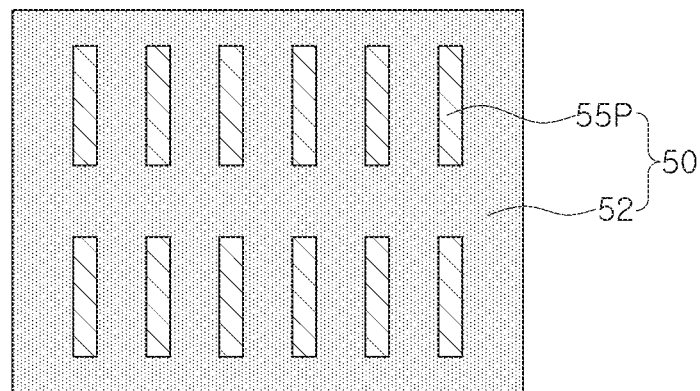
FIGS. 3A and 3C are planar views of various examples of the composite dissipating layers which can be employed in the semiconductor device according to an example embodiment.
Figure 3B:
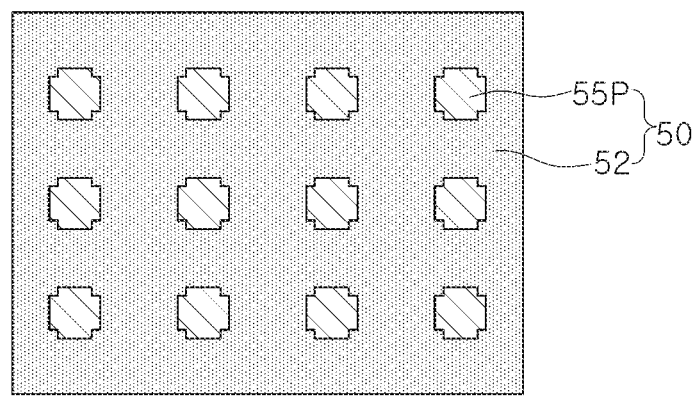
Figure 3C:
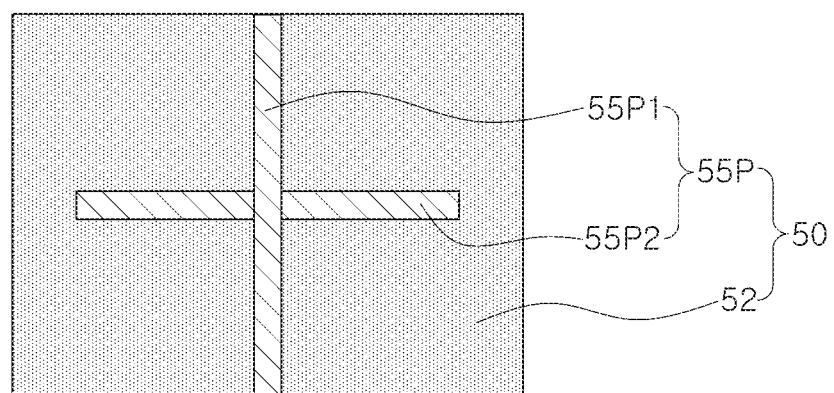

FIGS. 3A and 3C are planar views of various examples of the composite dissipating layers 50 (e.g., the vertical patterns 55P) which can be employed in the semiconductor device according to an example embodiment.

A plurality of the vertical patterns 55P illustrated in FIG. 3A may have a rectangular shape or a bar-like shape in a plan view. FIG. 3 illustrates a plurality of the vertical patterns 55P having a cross shape. However, the shapes of the vertical patterns 55P according to example embodiments are not limited thereto. The vertical patterns 55P may have various shapes and arrangements.

As described in the above described example embodiments (FIGS. 1, 3A and 3B), it is desirable that the first heat dissipation member 52 have a single sheet-structure so that a heat dissipation path is not disconnected in the vertical direction by the closed-type vertical patterns.

In some example embodiments, the vertical patterns 55P may cross the first heat dissipation member 52. That is, as illustrated in FIG. 3C, the vertical patterns 55P may contain first and second vertical patterns 55P1 and 55P2, which intersect with each other, and the first vertical pattern 55P1 may be configured to divide the first heat dissipation member 52 into two regions.

Meanwhile, the vertical patterns 55P may have various shapes of cross-sections in the thickness direction of the composite dissipating layer 50. For example, the cross-sections of the vertical patterns 55P may have a shape of a jar, a regular trapezoid or a reversed trapezoid, depending on the shape of the mask pattern illustrated in FIG. 4B.

FIGS. 4A to 4E are side cross-sectional views illustrating a method of manufacturing a semiconductor device according to an example embodiment. The manufacturing method includes formation of the composite heat dissipating layer and can be achieved at a wafer level.

Figure 4A:
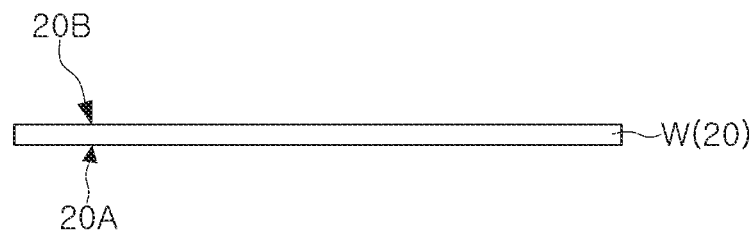
FIGS. 4A to 4E are side cross-sectional views illustrating a method of manufacturing a semiconductor device according to an example embodiment.

Based on FIG. 4A, a wafer W is prepared for a plurality of semiconductor chips. The wafer W may contain silicon, and in another example embodiment, may contain a mono element semiconductor such as germanium or a compound semiconductor such as silicon carbide (SiC), gallium arsenide (GaAs), indium arsenide (InAs) and indium phosphide (InP). A plurality of the semiconductor chips employed in the wafer may be the same as the semiconductor chips 20 illustrated in FIG. 1. For example, numerous active/passive elements (e.g., transistor) and a connection pad connected thereto may be formed on a first surface 20A of the wafer W through a series of a semiconductor process. A composite heat dissipating layer may be provided on a second surface 20B (i.e., a non-active surface) of the wafer W through subsequent processes.

Figure 4B:
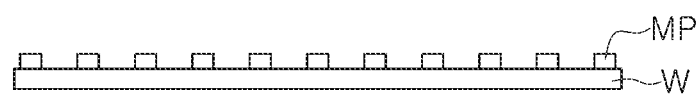

Based on FIG. 4B, a mask pattern MP is formed on the second surface 20B of the wafer W.

The mask pattern MP may be provided such that at least one region of the second surface 20B is exposed. The at least one region defines a region in which the first heat dissipation member (52 of FIG. 4C) is formed, and the mask pattern MP defines the regions at which the second heat dissipation member (55 of FIG. 4E) is in contact with the second surface 20B of the wafer W (e.g., the regions at which the vertical patterns (55P of FIG. 4E) are formed). In the present example embodiment, the mask pattern MP may be a plurality of divided mask patterns, and the exposed region may be a plurality of sub-regions connected as one. A planar shape of the mask pattern MP may define a planar shape of the vertical patterns. For example, in the case of forming the composite heat dissipating layer 50 illustrated in FIGS. 1 and 2, the mask pattern MP may be a plurality of circular mask patterns.

Figure 4C:
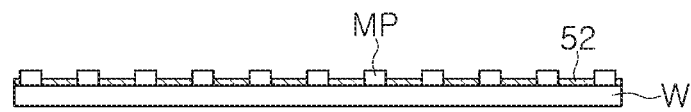

Based on FIG. 4C, the first heat dissipation member 52 is formed in the one region of the second surface 20B of the wafer W.

The first heat dissipation member 52 may be formed with a material having vertical thermal conductivity in a direction perpendicular to a surface direction lower than horizontal thermal conductivity in the surface direction. For example, the first heat dissipation member 52 may be formed of graphite or graphene. The first heat dissipation member 52 may be formed in the form of a sheet using a film-forming process such as a deposition process. As in the present example embodiment, the first heat dissipation member 52 is formed to be directly in contact with the second surface 20B of the wafer W without using an additional adhesive. As such, improved heat dissipation characteristics may be obtained or guaranteed, and delamination caused by a difference in thermal expansion coefficients may be reduced.

Figure 4D:
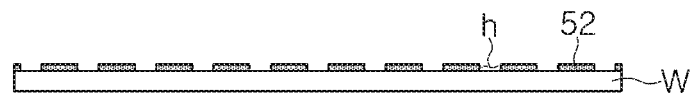

Further, based on FIG. 4D, the remaining regions of the wafer W may be exposed by removing the mask pattern MP.

In the present example embodiment, the region from which the mask patterns MP are removed may be provided in holes h of the first heat dissipation member 52. The holes h of the first heat dissipation member 52 may define a region in which the vertical patterns (55P of FIG. 4) are formed. A planar shape of the holes h are defined by the mask patterns MP as described above, and may be a closed-type pinhole (a structure surrounded by the first heat dissipation member 52). The planar shape may be achieved by another form of pinhole (see 55P of FIG. 3B).

Figure 4E:
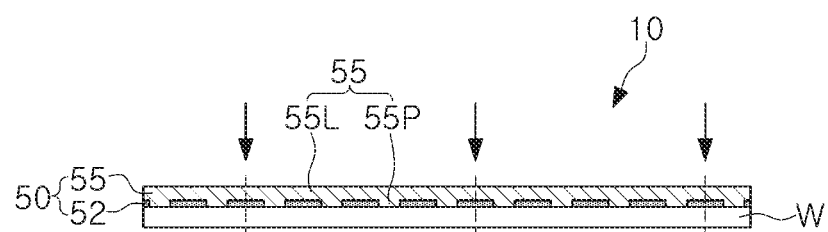

Based on FIG. 4E, a second heat dissipation member 55 having vertical patterns 55P may be formed in the remaining regions of the wafer W.

The second heat dissipation member 55 according to the present example embodiment may include vertical patterns 55P filling the holes 5 and a heat dissipating layer 55L disposed on the first heat dissipation member 52 and connecting the vertical patterns 55P with each other. The second heat dissipation member 55 may be formed by a material having vertical thermal conductivity higher than that of the first heat dissipation member 52 (e.g., graphite). For example, the second heat dissipation member 55 may be formed of metal (e.g., Cu).

In the present example embodiment, the vertical patterns 55P and the heat dissipating layer 55L may be metal patterns and a metal layer, respectively. The vertical patterns 55P may be connected to the heat dissipating layer 55L disposed on the first heat dissipation member 52 to form a vertical heat dissipation path, while being in direct contact with the second surface 20B of the wafer W through the holes h of the first heat dissipation member 52. Heat generated from the waver W may be actively or effectively dissipated in the vertical direction through the vertical heat dissipation path. Thus, the low vertical thermal conductivity of the first heat dissipation member 52 may be compensated through the vertical heat dissipation path by the second heat dissipation member 55.

The wafer W illustrated in FIG. 4E may be cut into an individual chip unit together with the composite heat dissipating layer 50 to provide the semiconductor device 10 illustrated in FIG. 1.

Figure 5:
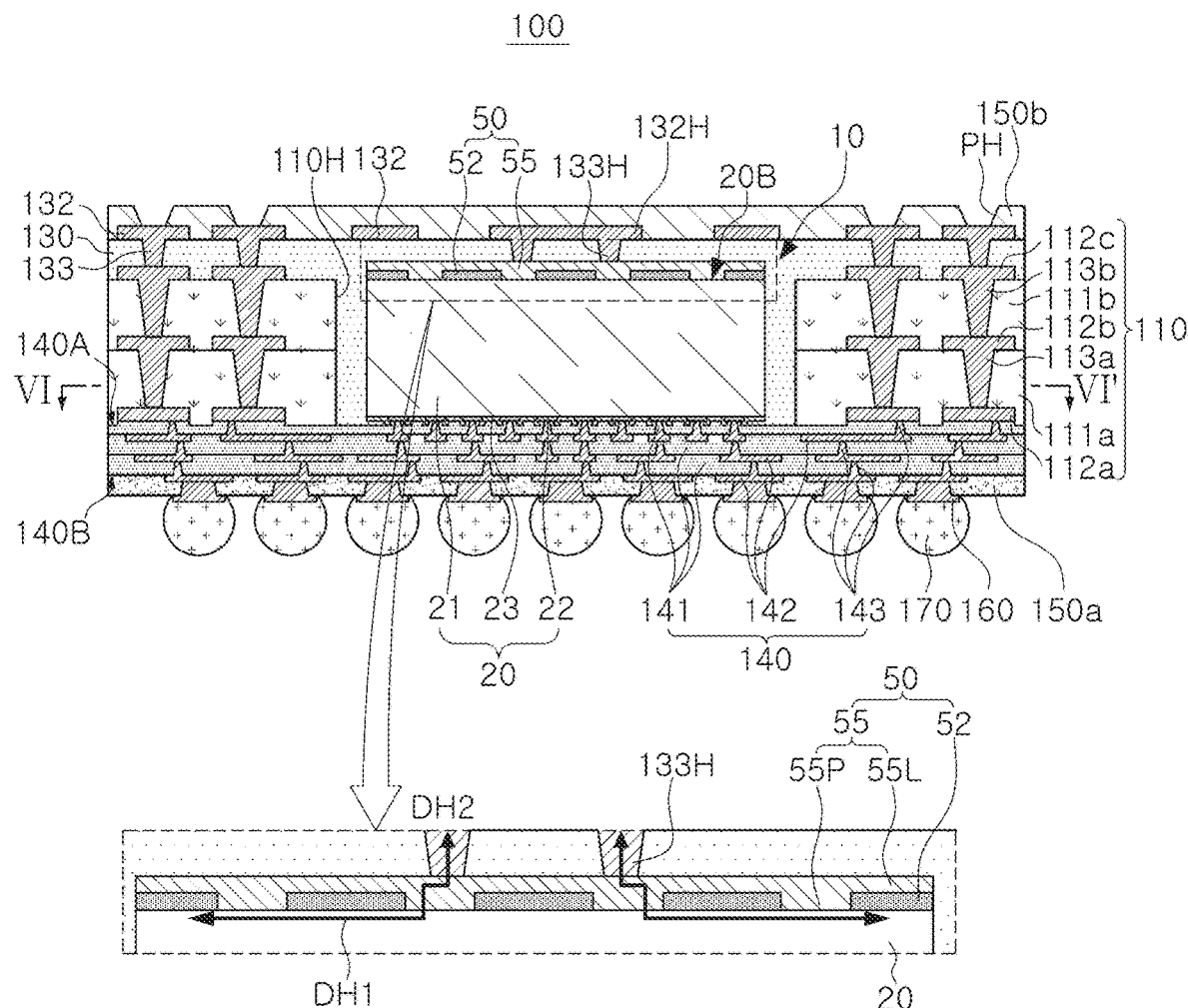
FIG. 5 is a side cross-sectional view of a semiconductor package according to an exemplary embodiment.
Figure 6:
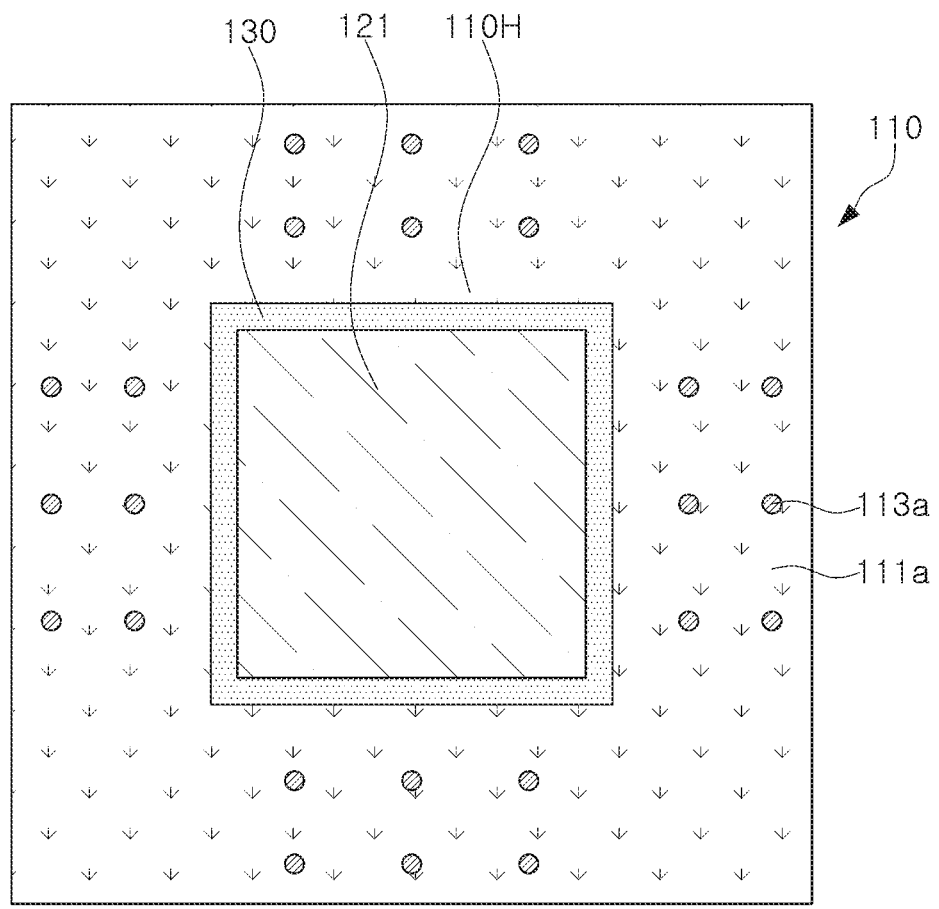
FIG. 6 is a planar view of the semiconductor package of FIG. 5 taken along line VI-VI'.

FIG. 5 is a side cross-sectional view of a semiconductor package according to an example embodiment, and FIG. 6 is a planar view of the semiconductor package of FIG. 5 taken along line VI-VI'.

Based on FIGS. 5 and 6, a semiconductor package 100 according to the present example embodiment may include a package substrate 140 including a redistribution layer, a semiconductor device 10 disposed on the package substrate 140, and a sealing member 130 sealing the semiconductor device 10 on the package substrate (or alternatively, redistribution) substrate 140. The semiconductor device 20 may be the semiconductor device illustrated in FIGS. 1 and 2.

The semiconductor device 10 includes a semiconductor chip 20 having a first surface 20A including a connection pad 22 electrically connected to redistribution layers (142 and 143) and a second surface 20B disposed opposite to the first surface 20A, and a composite heat dissipating layer 50 disposed on the second surface 20B.

The sealing member 130 may protect a frame 110 and a semiconductor chip 20. For example, the sealing member 130 may cover an upper surface of the frame 110 and a heat dissipating layer 50 located on the second surface 20B of the semiconductor chip 20.

The composite heat dissipating layer 50 employed in the present example embodiment may include a first heat dissipating layer 52 (also referred as "the first heat dissipation sheet") disposed on the second surface 20B of the semiconductor chip 20, a vertical pattern 55P penetrating the first heat dissipation sheet 52, and a second heat dissipation sheet 55L (also referred as "heat dissipating layer" of the second heat dissipation member 55) disposed on the first heat dissipation sheet 52 and connected to the vertical pattern 55P.

The first heat dissipation sheet 52 contains a material having a vertical thermal conductivity, in a direction perpendicular to the second surface 20B, smaller than a horizontal thermal conductivity in a direction parallel to the second surface 20B and a vertical thermal conductivity of the vertical patterns 55P penetrating the first heat dissipation sheet. The vertical pattern 55P and the second heat dissipation sheet 55L have a vertical thermal conductivity greater than the vertical thermal conductivity of the first heat dissipation sheet 52, and may contain the same material.

For example, the first heat dissipating layer 52 contain at least one of graphite or graphene, and the vertical pattern 55P and the second heat dissipation sheet 55L may contain metal. As used herein, the terms "vertical pattern 55P" and "second heat dissipation sheet 55L" may be referred as "second heat dissipation member 55."

Heat generated from the semiconductor chip 20 may be effectively released through the first heat dissipating layer 52 having an excellent horizontal thermal conductivity. For example, as the graphite has an average horizontal thermal conductivity of as high as 1,500 W/m·k to 1,700 W/m·k, the first heat dissipation sheet 52 formed on the second surface 20B of the semiconductor chip 20 can facilitate effective heat dissipation in a side direction by providing a horizontal heat dissipation path DH1. Due to the sealing member 130 having comparatively lower thermal conductivity and sealing a corner (e.g., a side) of the first heat dissipation sheet 52, however, sufficient heat dissipation may not be achieved.

To compensate the above, the composite heat dissipating layer 50 may secure a vertical heat dissipation path through the vertical pattern 55P and the second heat dissipation sheet 55L both having comparatively higher vertical thermal conductivity. Further, the semiconductor package 100 in the present example embodiment uses a heat dissipation via 133H and a heat dissipation pattern 132H connected to the composite heat dissipating layer 50 to extend the vertical heat dissipation path DH2.

For example, the heat dissipation pattern 132H may be disposed on an upper surface of the sealing member 130 and at a position corresponding to the composite heat dissipating layer 50. The heat dissipation via 133H may penetrate a portion of the sealing member 130 to connect the heat dissipation pattern 132H and the composite heat dissipating layer 50.

In the present example embodiment, the heat dissipation via 133H may be connected to the second heat dissipation sheet 55L of the composite heat dissipating layer 50. Such an arrangement may facilitate provision of the extended vertical heat dissipation path DH2 connecting the vertical pattern 55P, the second heat dissipation sheet 55L, the heat dissipation via 133H and the heat dissipation pattern 132H. Thus, such a vertical heat dissipation path DH2 may extend toward the outside of the sealing member 130, and accordingly more effective heat dissipation can be expected as compared to the horizontal heat dissipation path DH1.

The heat dissipation pattern 132H and the heat dissipation via 133H may include metal having a relatively high thermal conductivity and may be formed of the same material as that of backside redistribution layers 132 and 133. In some example embodiments, the heat dissipation pattern 132H and the heat dissipation via 133H may be the same material as the vertical pattern 55P and the second heat dissipation sheet 55L (e.g., Cu).

The redistribution substrate 140 includes a first surface 140A and a second surface 140B disposed opposite to each other. The redistribution substrate 140 may include three layers of the redistribution layers (142 and 143) on a plurality of (e.g., three) of insulating layers 141. The redistribution layers (142 and 143) may include a redistribution pattern 142 disposed on the insulating layer 141 and a redistribution via 143 penetrating the insulating layer 141 and connecting vertically neighboring redistribution patterns 142. The semiconductor chip 20 is disposed on the first surface 140A of the redistribution substrate 140, and the connection pad 22 located on the first surface 20A of the semiconductor chip 20 may be connected to the redistribution layer (e.g., redistribution via 143).

The redistribution substrate 140 employed in the present example embodiment includes three insulating layers 141 as well as three redistribution layers 143 and 143. In some example embodiments, however, the redistribution substrate 140 may have a single layer, bilayers, or a larger number of layers. The insulating layer 141 may be a photosensitive insulating material such as a photoimageable dielectric (PID) resin. The insulating layer 141, even when configured to have multilayers, may have unclear interlayer boundaries depending on the material and process of each layer.

As illustrated in FIG. 5, the semiconductor package 100 may further include a frame 110, backside redistribution layers (RDL) 132 and 133, first and second passivation layers 150*a* and 150*b*, an under-bump metal 160 and an electric connection metal 170.

The frame 110 is disposed on the first surface 140A of the package substrate 140 and may include a cavity 110H in which a semiconductor chip 20 is accommodated. The frame 110 includes a wiring structure providing electrical connections between upper and lower surfaces. The wiring structure employed in the present example embodiment may include first to third wiring patterns 112*a* to 112*c* and first and second wiring vias 113*a* and 113*b* providing connections between the first to third wiring patterns 112*a* to 112*c*, but is not limited thereto. In some example embodiments, the wiring structure may be formed to have a different number of layers and a different structure (see FIG. 10A). The wiring structure (e.g., the first wiring pattern 112*a*) of the frame 110 may be connected to the redistribution layers 142 and 143 of the redistribution substrate 140 to be electrically connected to the semiconductor chip 20.

In the present example embodiment, the sealing member 130 is extended so as to cover the upper surface of the frame 110. The semiconductor package 110 may further include the backside redistribution layers 132 and 133 disposed on the sealing member 130 and electrically connected to the wiring structure (e.g., the third wiring pattern 112*c*). The backside redistribution layer 132 may include a wiring pattern 132 disposed on the sealing member 130 and a wiring via 133 penetrating a portion of the sealing member 130 to connect the third wiring pattern 112*c* to the wiring pattern 132.

As previously described, the wiring pattern 132 and the wiring via 133, which configure the backside redistribution layers, may be formed as the same material as the heat dissipation pattern 132H and the heat dissipation via 133H through the same process.

The frame 110 is a selective configuration and may provide improved rigidity of the semiconductor package 100 depending on specific materials thereof. The frame 110, as previously described, has the wiring structure providing electrical connections between the upper and lower surfaces thereof, thereby enabling the semiconductor package 100 to be used as a package on package (POP)-type package. The semiconductor chip 20 disposed in a cavity 110H of the frame 110 may be spaced apart in a predetermined distance from an inner side wall of the frame 110. A side surface area of the semiconductor chip 20 may be surrounded by the frame 110, but is not limited thereto, and can be modified in various forms accompanying different functions accordingly.

As previously described, the frame 110 includes a first insulating layer 111*a* in contact with the redistribution substrate 140, a wiring pattern 112 in contact with the redistribution substrate 140 and embedded in the first insulating layer 111*a*, a second wiring pattern 112*b* disposed in a second surface of the first insulating layer 111*a*, which is opposite to a first surface of the first insulating layer 111*a* on which the first wiring pattern 112*a* is embedded, a second insulating layer 111*b* disposed on the first insulating layer 111*a* and covering the second wiring 112*b*, and a third wiring pattern 112*c* disposed on the second insulating layer 111*b*. The first to third wiring patterns 112*a* to 112*c* are electrically connected to the connection pad 22. The first to third wiring patterns 112*a* to 112*c* are electrically connected to each other via the first and second wiring vias 113*a* and 113*b* penetrating the first and second insulating layers 111*a* and 111*b*, respectively.

As in the present example embodiment, when the first wiring pattern 112*a* is embedded inside the first insulating layer 111*a*, a step occurring by a thickness of the first wiring pattern 112*a* can be minimized, thereby making an insulation distance of the redistribution substrate 140 more constant. When the first wiring pattern 112*a* is recessed into the first insulating layer 111*a*, such that each of a lower surface of the first insulating layer 111*a* and that of the first wiring pattern 112*a* has a step. In this case, it may be possible to mitigate or prevent the first redistribution layer 112*a* from being polluted due to an absence of bleeding of a material for forming the sealing member 130. The frame 110 is manufactured to have a sufficiently large thickness through a substrate process, or the like, whereas the redistribution substrate 140 is manufactured to be thin through a semiconductor process, or the like. In this regard, a thickness of each of the first to third wiring patterns 112*a* to 112*c* of the frame 110 may be greater than the redistribution layer 142 of the redistribution substrate 140.

For example, the insulating layers 111*a* and 111*b* may contain a thermosetting resin such as an epoxy resin, a thermoplastic resin such as a polyimide resin, or a composite resin in which the thermosetting resin or the thermoplastic resin is mixed with an inorganic filler and/or a glass fiber (a glass cloth or a glass fabric). In some example embodiments, the first and second insulating layers 111*a* and 11*b* may include prepreg, Ajinomoto Build-up film (ABF), FR-4, or bismaleimide triazine (BT).

The first to third wiring vias 113*a* and 113*b*, electrically connected to the first to third wiring layers 112*a* to 112*c* formed on different insulating layers 111*a* and 111*b*, may form a wiring structure having an interlayer-connecting path within the frame 110. The first and second wiring vias 113*a* and 113*b* may be formed of the previously described conductive material. In some example embodiments, the first and second wiring vias 113*a* and 113*b* may be integrally formed with the second and third wiring patterns 112*b* and 112*c* through the same process.

The first and second passivation layers 150*a* and 150*b* may protect the redistribution substrate **140* and a backside redistribution pattern 132, respectively, from external physical or chemical damage, or the like. The first and second passivation layers 150a and 150b may contain the previously described insulating material. In some example embodiments, the first and second passivation layers 150a and 150b may include prepreg, ABF, FR-4, BT, a solder resist or PID. The first and second passivation layers 150a and 150b may have a pinhole PH partially opening the redistribution pattern 142 and the backside redistribution pattern 132. A surface treatment layer (not illustrated) may be formed by plating (e.g., noble metal plating) in an exposed region of the backside redistribution pattern 132.

The under-bump metal 160 may be formed by a known metallization method in the pinhole of the first passivation layer or an outermost insulating layer of the insulating layer 141, but is not limited thereto. The electric connection metal 170 may electrically and/or physically connect the semiconductor package 110 to an external apparatus such as a mainboard of an electric device. The electric connection metal 170 may contain low-melting temperature metal (e.g., a solder such as a tin (Sn)-aluminum (Al)-copper (Cu)). The electric connection metal 170 may have multilayers or a single layer. For example, a multilayer electric connection metal may contain a pillar and a solder, and a single layer connection metal may contain a tin-silver solder or a copper.

FIGS. 7A to 7D are side cross-sectional views illustrating a method of manufacturing a semiconductor package according to an example embodiment.

Figure 7A:
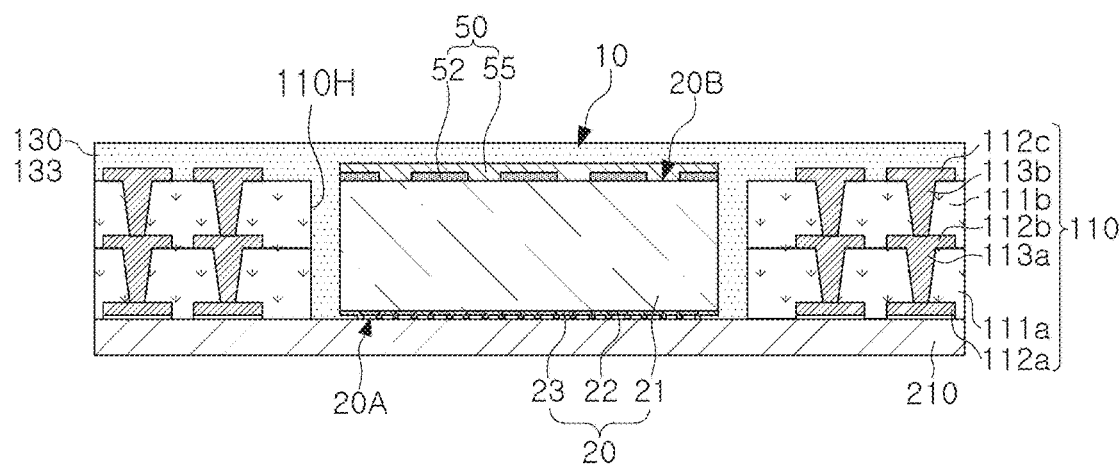
FIGS. 7A to 7D are side cross-sectional views illustrating a method of manufacturing a semiconductor package according to an example embodiment.

Based on FIG. 7A, the frame 110 having a cavity 110H is disposed on a first carrier film 210, a semiconductor chip 20 is accommodated in the cavity 110H, and a sealing member 130 is formed on the frame 110 and the semiconductor chip 20.

The frame 110 employed in the present example embodiment, as previously described, include a wiring structure together with first and second insulating layers 111a and 111b, and the wiring structure includes 3 layers of wiring patterns 112a to 112c and distribution vias 113a and 113b providing connections between the wiring patterns 112a to 112c. The first carrier film 210 is attached to a lower side of the first insulating layer 111a. For example, the first carrier film 210 may be an adhesive tape containing an epoxy resin.

A semiconductor chip 120 may be built in the cavity 110H of the frame 110. As previously described, a composite heat dissipating layer 50 may be disposed on a second surface 20B of the semiconductor chip 20. A side surface of the composite heat dissipating layer 50 may be substantially coplanar with that of the semiconductor chip 20 (see FIG. 4E). The semiconductor chip 20 is disposed such that a first surface 20A, on which the connection pad 22 is formed, faces the first carrier film 210. A sealing member 130 seals the semiconductor chip 20 using the previously described sealing material. The sealing member 130 can cover the composite heat dissipating layer 50 applied to the semiconductor chip 20 and is extended to an upper surface of the frame 110 to cover the third wiring pattern 112c.

Figure 7B:
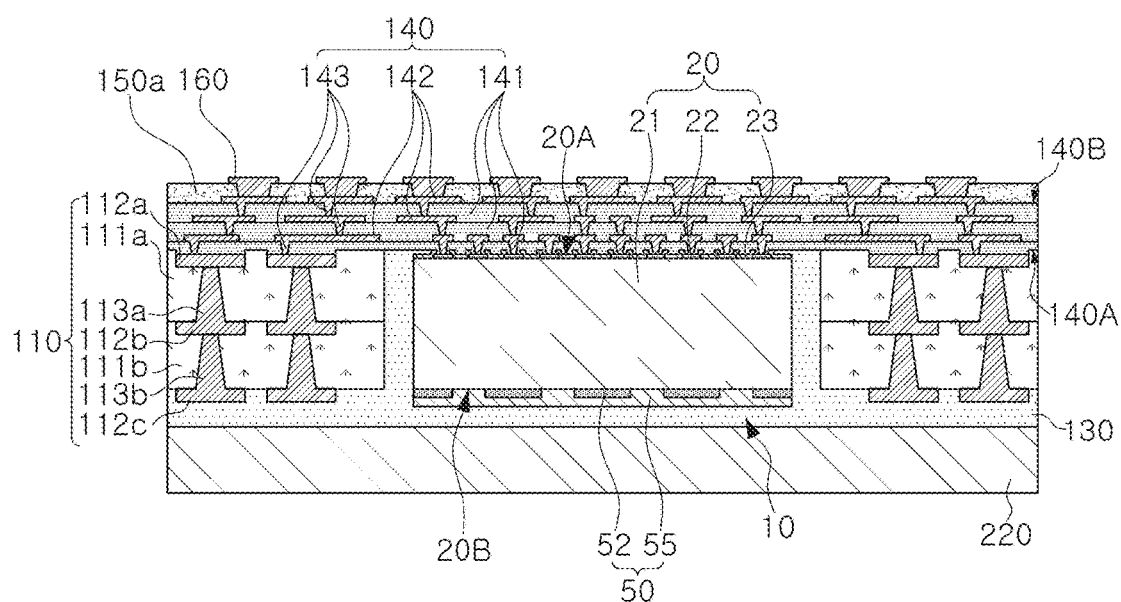

Based on FIG. 7B, a second carrier film 220 is attached to an upper surface of the sealing member 130, and the first carrier film 210 is removed to form a redistribution substrate 140 thereon.

The forming process of the redistribution substrate 140 may include formation of an insulating layer 141 using a lamination or application method, formation of a via hole on the insulating layer 141 and formation of a first redistribution pattern 142 and a redistribution via 143 by an electrolytic or electroless plating method. When a PID is used as the insulating layer, the via hole may be formed at a fine pitch using a photolithography method.

In some example embodiments, as illustrated in FIG. 7B, the first passivation layer 150a and an under-bump metal layer 160 may further be formed. The first passivation layer 150a is formed on a lower surface 140B of the redistribution substrate 140, and a plurality of pinholes exposing a portion of the first redistribution pattern 142 are formed on the first passivation layer 150a. The under-bump metal layer 160 is then formed on the first passivation layer 150a so as to be in contact with the exposed region of the first redistribution pattern 142 through a plurality of the pinholes.

Figure 7C:
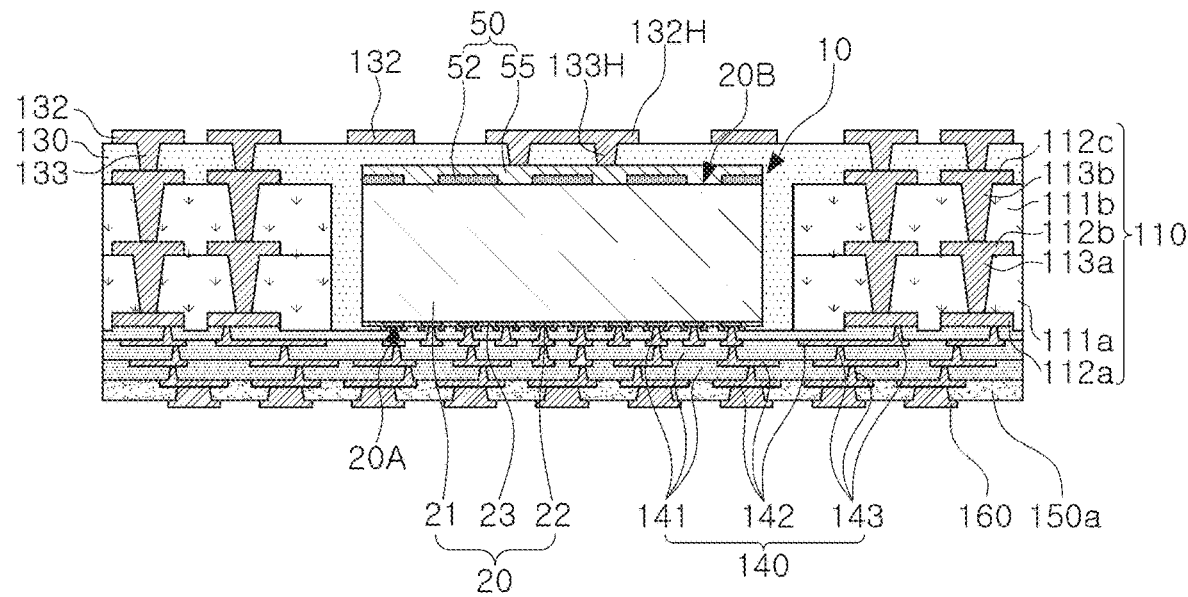

Based on FIG. 7C, the second carrier film 220 is removed from the sealing member 130, and the heat dissipation pattern 132H and the heat dissipation via 133H are formed together with the backside redistribution layers 142 and 143.

After the second carrier film 220 is removed, pinholes are formed in the sealing member 130 such that a portion of the third redistribution layer 112C and a portion of the composite heat dissipating layer 50 (e.g., the second heat dissipation sheet 55L) are exposed. This process may be carried out by a hole-forming process such as a laser drill process, but is not limited. For example, the sealing member 130 may be formed by a photolithography process when formed as a PID.

A photoresist pattern opening the pattern-forming region can be formed on the upper surface of the sealing member 130, and the heat dissipation pattern 132H and the heat dissipation via 133H can be formed together with the backside redistribution layers 142 and 143 using a plating process. For example, a wiring pattern 132 and the heat dissipation pattern 132H are formed on a surface of the sealing member 130, and a wiring via 133 connecting the wiring pattern 132 and the third wiring pattern 112c, and a heat dissipation via 133H connecting the second heat dissipation sheet 55L to the heat dissipation pattern 132H may be formed. In this process, each of the wiring via 133 and the heat dissipation via 133H may be integrally formed with the wiring pattern 132 and the heat dissipation pattern 132H. Further, the heat dissipation pattern 132H and the heat dissipation via 133H are formed by the same plating process, and thus may be formed of the same material as the backside redistribution layers 132 and 133.

As described above, the heat dissipation pattern 132H and the heat dissipation via 133H are connected to the vertical pattern 55P and the second heat dissipation sheet 55L, and thus may provide a vertical heat dissipation path DH2 extended to the outside of the sealing member 130. Such vertical heat dissipation path DH2 can provide an improved heat dissipation effect.

Figure 7D:
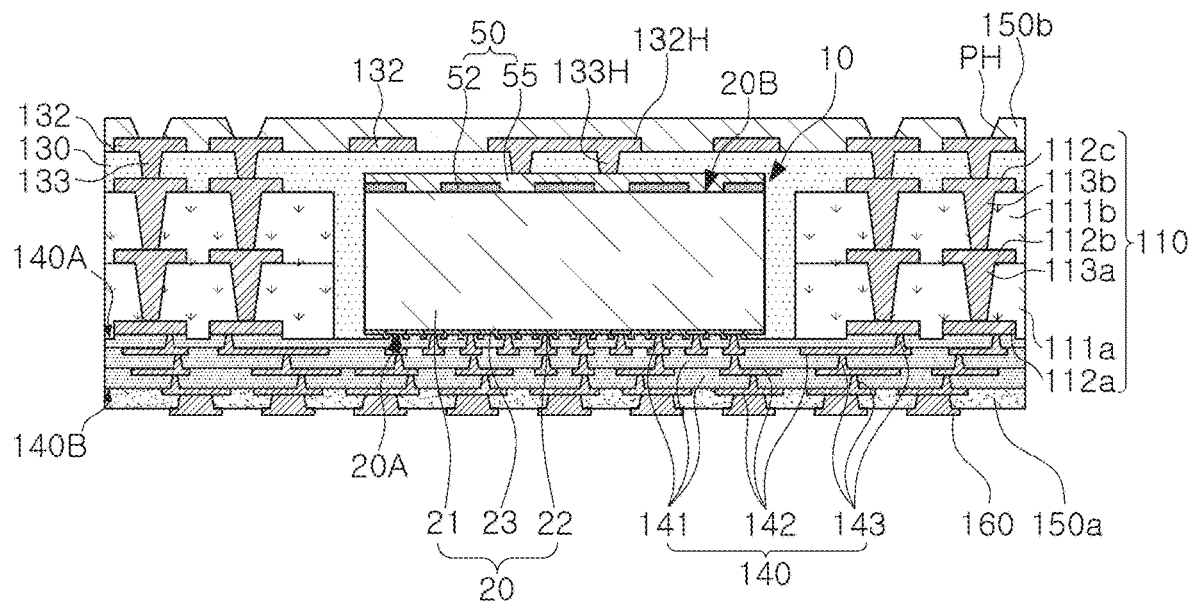

As illustrated in FIG. 7D, the second passivation layer 150b is formed on the sealing member 130 so as to cover the backside redistribution layers (132 and 133) and the heat dissipation pattern 132H, and a pinhole PH exposing a portion of the wiring pattern 132 is formed on the second passivation layer 150b. In addition, an electric connection metal 170 can be formed on the under-bump metal layer 160.

The manufacturing method of the semiconductor package described above describes a process of manufacturing a single package. In some example embodiments, such a series of processes can be carried out at a panel level, at which a plurality of the semiconductor packages (e.g., 4×4) can be simultaneously manufactured.

Figure 8:
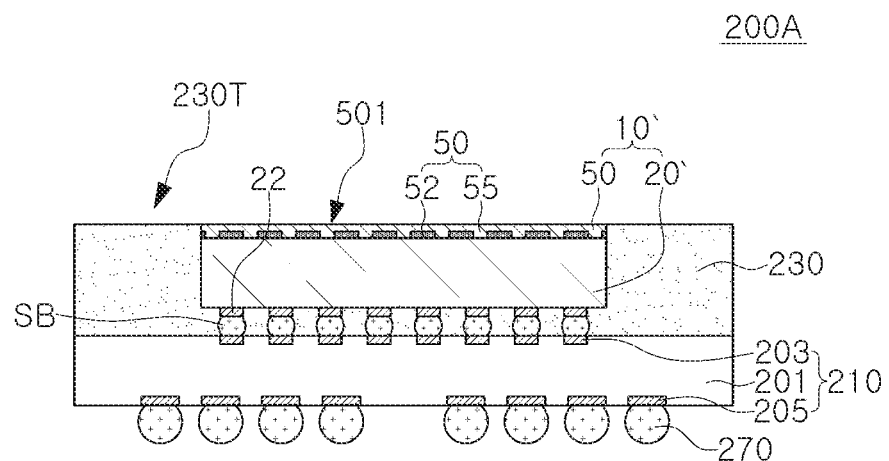
FIGS. 8 and 9 are side cross-sectional views of various examples of semiconductor packages according to some example embodiments.
Figure 9:
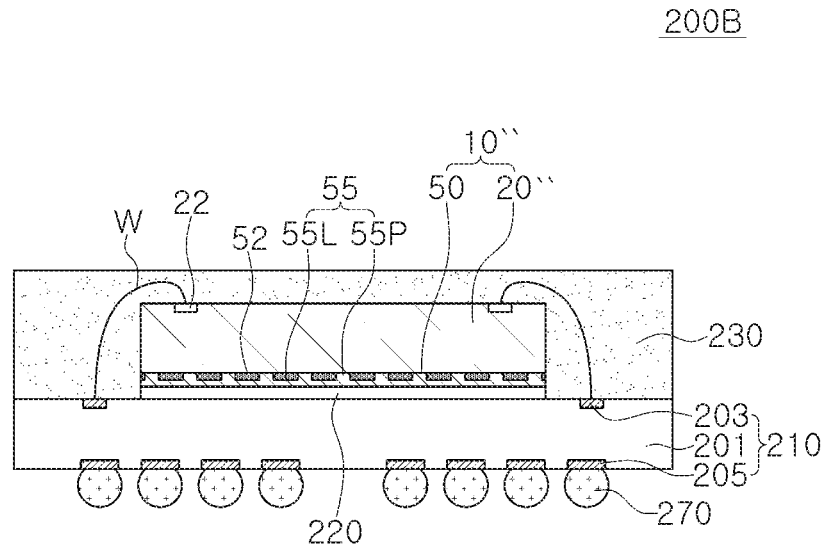

The semiconductor device according to the present example embodiment can be usefully applied to a semiconductor package having a different structure. FIGS. 8 and 9 are side cross-sectional views of semiconductor packages according to various example embodiments.

Based on FIG. 8, a semiconductor package 200A according to the present example embodiment includes a package substrate 210, a semiconductor device 10' disposed on the package substrate 201, and a sealing member 230 disposed on the package substrate 210 and surrounding the semiconductor device 10'.

The package substrate 210 may include a body 201, an upper substrate pad 203 on an upper surface of the body 201, and a lower substrate pad 206 on a lower surface of the body 201. Further, the package substrate 210 may have a wiring pattern (not illustrated) and a connection via (not illustrated) collectively providing electrical connections between the upper and lower substrate pads 203 and 205. For example, the package substrate 210 may be a printed circuit board (PCB), but is not limited thereto, and may be a wiring substrate in various forms.

The semiconductor device 10' employed in the present example embodiment includes a the semiconductor chip 20' having a first surface on which a connection pad is formed and a second surface disposed oppositely to the first surface, and a composite heat dissipating layer 50 disposed on the second surface of the semiconductor chip 20'. The composite heat dissipating layer 50, as that illustrated in the example embodiment of FIGS. 1 and 2, includes a first heat dissipation member 52 having a horizontal thermal conductivity higher than a vertical thermal conductivity and having a sheet shape, and a second heat dissipation member 55 disposed on the first heat dissipation member 52 and having a vertical thermal conductivity higher than a horizontal thermal conductivity. The second heat dissipation member 55 includes vertical patterns 55P penetrating the first heat dissipation member 52 and a heat dissipating layer 55L disposed on the first heat dissipation member 52 and connected to the vertical patterns 55P.

In the present example embodiment, the semiconductor chip 20' is built on the package substrate 210 such that the first surface of the semiconductor chip 20' faces the upper surface of the package substrate 210. The connection pad 22 of the semiconductor chip 20' may be connected to the upper substrate pad 203 by a conductive bump SB. The composite heat dissipating layer 50 located on the second surface of the semiconductor chip 20' may be disposed to face upward. As illustrated in FIG. 8, the second heat dissipation member 55 of the composite heat dissipating layer 50 may be exposed through an upper surface 230T of the sealing member 230. For example, the upper surface of the composite heat dissipating layer 50L may be substantially coplanar with the upper surface 230T of the sealing member 230.

Based on FIG. 9, a semiconductor package 200B according to the present example embodiment may have the same or substantially similar structure to that illustrated in FIG. 8, except that a semiconductor device 10" is connected to a package substrate 210 by a wire W. Accordingly, the descriptions of the example embodiment illustrated in FIG. 8 can be applied to the present example embodiment, unless indicated otherwise.

The semiconductor device 10" employed in the present example embodiment may be disposed on the package substrate 210, unlike the semiconductor device 10' illustrated in FIG. 8. For example, the semiconductor device 10" may be disposed on the package substrate 210 such that a first surface of the semiconductor device 10" on which a connection pad 22 is disposed faces upward, and a connection pad 22 of the semiconductor device 20" is connected to the upper substrate pad 203 by the wire W. The semiconductor chip 20" may be built in the package substrate 20 such that a composite heat dissipating layer 50 located on a second surface of the semiconductor chip 20", which is opposite to the first surface of the semiconductor chip 20", faces the upper surface of the package substrate 210. As illustrated in FIG. 9, the upper surface of the package substrate 210 and the composite heat dissipating layer 50 may be attached to each other by an adhesive layer 220. In some example embodiments, the adhesive layer 220 may be an adhesive material for heat dissipation. For example, the adhesive material for heat dissipation may contain a thermal interface material (TIM).

The composite heat dissipating layer may be modified to have various structures. The vertical patterns have variously shaped patterns in a planar view illustrated in FIGS. 3A to 3C, but various shaped patterns of the vertical pattern in a planar view according to example embodiments are not limited thereto. In some example embodiments, the vertical patterns may have a single pattern in a large surface area (FIGS. 10A and 10B) or may be located along at least one edge of the first heat dissipation member (or the first heat dissipation sheet) (FIGS. 11A and 11B).

Figure 10B:
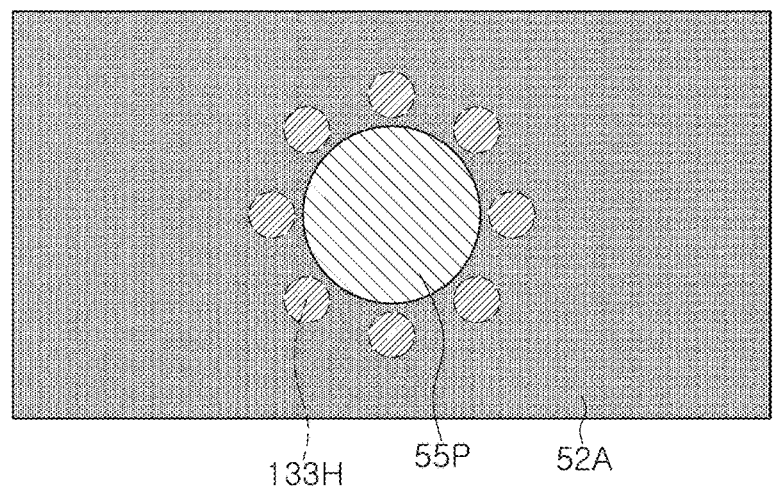

FIG. 10 is a side cross-sectional view of a semiconductor package according to an example embodiment, and FIG. 10B is a planar view of a composite heat dissipating layer taken along line XB-XB' of the semiconductor package of FIG. 10A.

Based on FIGS. 10A and 10B, the semiconductor package 100A according to the present example embodiment may have the same or substantially similar structure to those illustrated in FIGS. 5 and 6, except that the vertical pattern 55P of the composite heat dissipating layer 50A has a single structure and a wiring structure of a frame 110' has a different structure. Accordingly, the descriptions of the example embodiments illustrated in FIGS. 5 and 6 can be applied to the present example embodiment, unless indicated otherwise.

The composite heat dissipating layer 50A employed in the present example embodiment includes a first heat dissipation member 52A in the sheet form and a second heat dissipation member 55 disposed on the first heat dissipation member 52A. The second heat dissipation member 55 has a vertical patter 55P located almost in a center region and a heat dissipating layer 55L connected thereto. The vertical pattern 55P may have a larger surface area as compared to the vertical pattern 55P previously suggested.

In the present example embodiment, a plurality of heat dissipation vias 133H connected to the heat dissipation pattern 132H may be connected to the heat dissipating layer 55L. As illustrated in FIG. 10B, a plurality of the heat dissipation vias 133H may be aligned to closely surround a region overlapping the vertical pattern 55P.

The frame 110' employed in the present example embodiment may have a different wiring structure from that of the frame 110 of the previous example embodiment. For example, the frame 110' may include a first insulating layer 111a, a first wiring pattern 112a disposed on one surface of the first insulating layer 111a, a second wiring pattern 112b disposed on the other surface of the first insulating layer 111a, a second insulating layer 111b disposed on one surface of the first insulating layer 111a and covering at least a portion of the first wiring pattern 112a, a third wiring pattern 112c disposed on a surface opposite to the side on which the first wiring pattern 112a of the second insulating layer 111b is embedded, a third insulating layer 111c disposed on the other surface of the first insulating layer 111a and covering at least a portion of the second wiring pattern 112b, a fourth wiring pattern 112d disposed on a surface opposite to the side on which the second wiring pattern 112b of the third insulating layer 111c is embedded, a first wiring via 113a penetrating the first insulating layer 111a and electrically connecting the first and second wiring patterns 112a and 112b, a second wiring via 113b penetrating the second insulating layer 111b and electrically connecting the first and third wiring patterns 112a and 112c, and a third wiring pattern 113c penetrating the third insulating layer 111c and electrically connecting the second and fourth wiring patterns 112b and 112d. As the frame employed in the present example embodiment has a larger number of the wiring patterns 112a to 112d, the redistribution layer 142 of the redistribution substrate 140 can be more simplified.

The first insulating layer 111a may be thicker than the second and third insulating layers 111b and 111c. The first insulating layer 111a may be comparatively thicker to basically maintain its rigidity, and the second and third insulating layers 111b and 111c may be introduced to form a larger number of the wiring patterns 112c and 112d. The first insulating layer 111a may contain an insulating material different from those of the second and third insulating layers 111b and 111c.

FIG. 11A is a side cross-sectional view of a semiconductor package according to an example embodiment, and FIG. 11B is a planar view of the semiconductor package of FIG. 11A taken along line XIB-XIB'.

Based on FIGS. 11A and 11B, the semiconductor package 110B according to the present example embodiment may have the same or substantially similar structure to those illustrated in FIGS. 5 and 6, except that the vertical pattern 55P of a composite heat dissipating layer 50B surround the first heat dissipation member 52A. Accordingly, the descriptions of the example embodiments illustrated in FIGS. 5 and 6 can be applied to the present example embodiment, unless indicated otherwise.

The composite heat dissipating layer 50B employed in the present example embodiment includes a first heat dissipation member 52B and a second heat dissipation member 55 disposed on the first heat dissipation member 52B. The first heat dissipation member 52B may be disposed in the remaining region excluding an edge region of the second surface of the semiconductor chip 20. The vertical pattern 55P of the second heat dissipation member 55 is disposed along the edge region of the second surface of the semiconductor chip 20. As illustrated in FIG. 11B, the vertical pattern 55P may be disposed so as to surround the first heat dissipation member 52B at the edge region of the semiconductor chip 20. The heat dissipating layer 55L is disposed on an upper surface of the first heat dissipation member 52B and connected to the vertical pattern 55P. In the present example embodiment, the second heat dissipation member 55 may be formed to cover a side surface and an upper surface of the first heat dissipation member 52B.

In such alignment, the first heat dissipation member 52B having a relatively high horizontal thermal conductivity releases heat in a horizontal direction, and the heat may be dissipated in a vertical direction along the vertical pattern 55P in contact with the side surface of the first heat dissipation member 52 and the heat dissipating layer 55L connected to the vertical pattern 55P.

Figure 13:
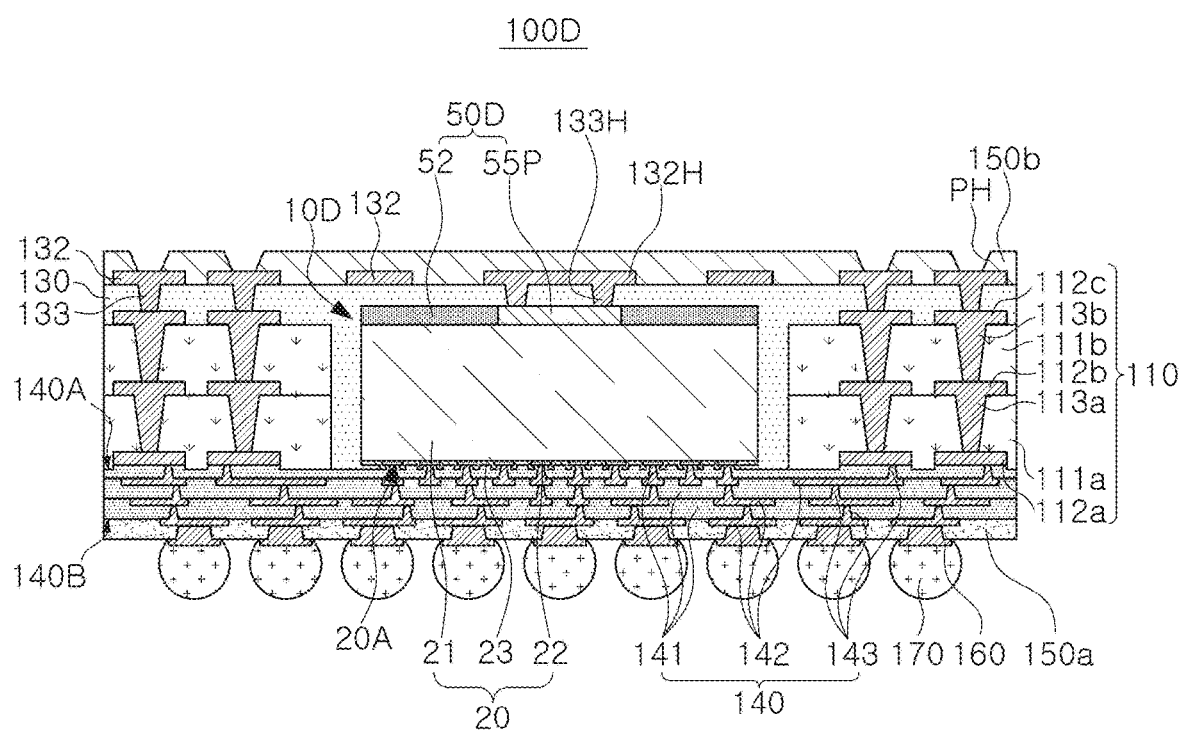
Figure 14:
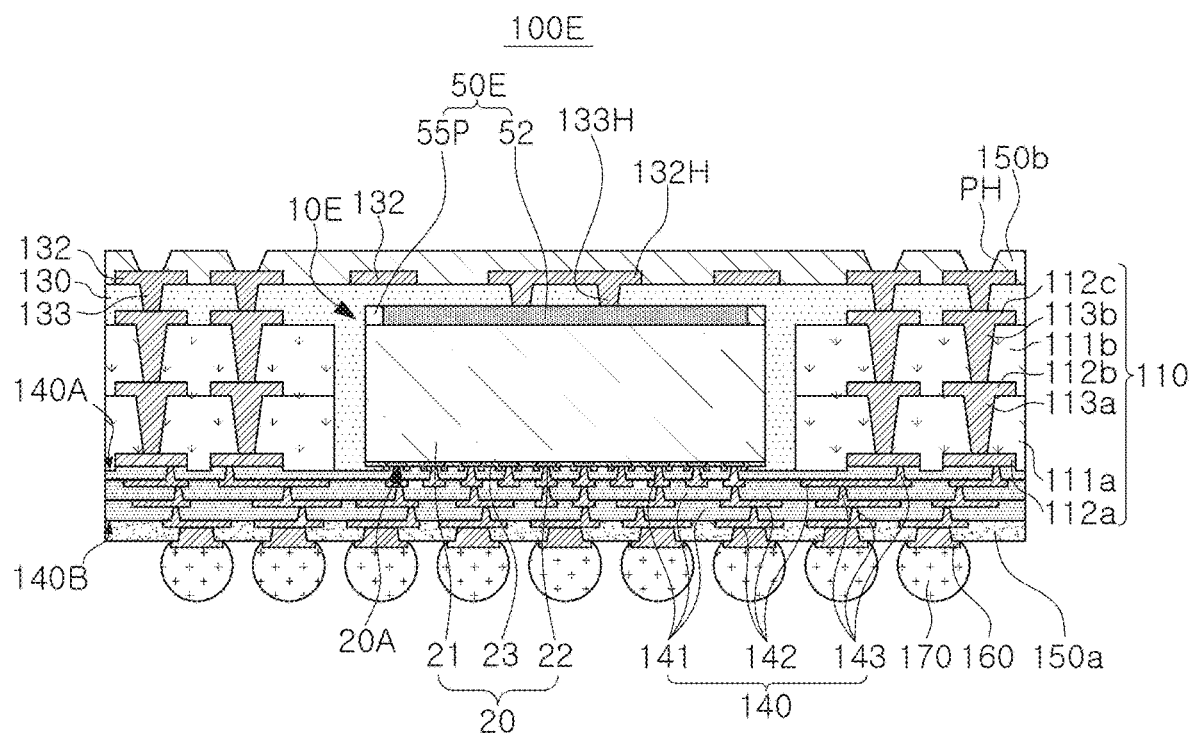

In the previous example embodiments, the composite heat dissipating layer is illustrated as having a bilayer structure (first heat dissipation sheet and an integrated structure of at least one vertical pattern and second heat dissipation sheet), but example embodiments are not limited thereto. In some example embodiments, the composite heat dissipating layer can be implemented as a single layer. For example, the second heat dissipation member may have a structure having the vertical patterns only and not including the second heat dissipation sheet (e.g., the heat dissipating layer), and the composite heat dissipating layer may be configured as the first heat dissipation member in the sheet form and a vertical pattern penetrating the first heat dissipation member. Such structures are illustrated in FIGS. 12 to 14.

Figure 12:
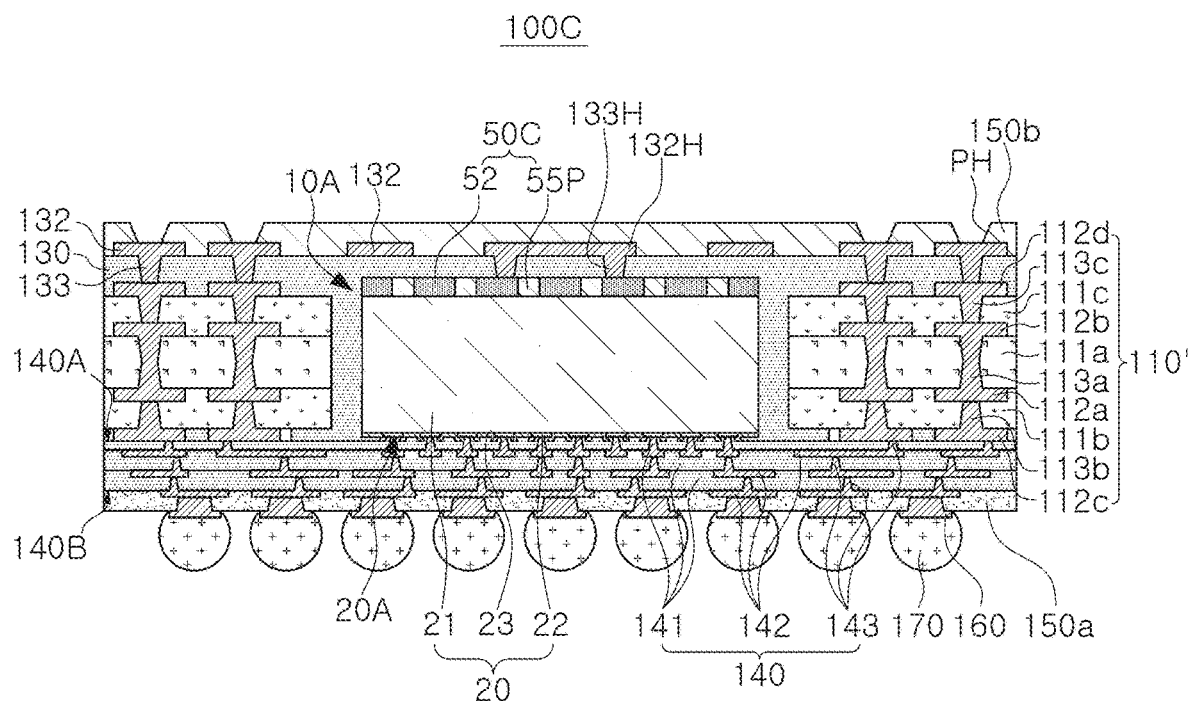

Based on FIG. 12, a semiconductor package 100C according to the present example embodiment may have the same or substantially similar structure to those illustrated in FIGS. 5 and 6, except that the composite heat dissipating layer 50C has a single layer structure and a wiring structure of the frame 110' is different. Accordingly, the descriptions of the example embodiments illustrated in FIGS. 5 and 6 can be applied to the present example embodiment, unless indicated otherwise.

The composite heat dissipating layer 50C employed in the present example embodiment has a single layer structure, and may include the first heat dissipation member 52 and a second heat dissipation member having a plurality of the vertical patterns 55P penetrating the first heat dissipation member 52. In other words, the composite heat dissipating layer 50C may include a heat dissipating layer 52 having a horizontal thermal conductivity greater than a vertical thermal conductivity and a plurality of the vertical patterns 55P penetrating the heat dissipating layer 52 and having a relatively high vertical thermal conductivity. The vertical patterns 55P may have arrangements as illustrated in FIGS. 2 and 3A to 3C. For example, the heat dissipating layer 52 may contain graphite, and the vertical pattern 55P may be a metal pattern such as a copper pattern.

The composite heat dissipating layer 50C may be connected to the heat dissipation pattern 132H disposed outside of the sealing member 130 via the heat dissipation via 53. As illustrated in FIG. 12, the heat dissipation via 133H, differently from those in the previous example embodiments, may be partially connected to the heat dissipation sheet 52.

The frame 110' employed in the present example embodiment may have the identical wiring structure to that illustrated in FIG. 10A. The description for the frame 110' of FIG. 10A can be applied to the present example embodiment.

Based on FIG. 13, a semiconductor package 100D according to the present example embodiment may have the same or substantially similar structure to those illustrated in FIGS. 5 and 6, except that the composite heat dissipating layer 50D has a single layer structure. Accordingly, the descriptions of the example embodiments illustrated in FIGS. 5 and 6 can be applied to the present example embodiment, unless indicated otherwise.

The composite heat dissipating layer 50D employed in the present example embodiment has a single layer structure but has a different shape from that 50C illustrated in FIG. 12. The composite heat dissipating layer 50D may include the first heat dissipation member 52 in the sheet form and the second heat dissipation member having a single vertical pattern 55P penetrating almost a center region of the first heat dissipation member 52. In other words, the composite heat dissipating layer 50D may include a heat dissipation sheet 52 having a horizontal thermal conductivity higher than a vertical thermal conductivity and vertical patterns 55P having a vertical thermal conductivity higher than the vertical thermal conductivity of the heat dissipation sheet 52, and penetrating the center (or central) region of the heat dissipating layer 50D. Such vertical patterns 55P may have an arrangement as illustrated in FIG. 10B. For example, the heat dissipation sheet 52 contains at least one of graphite and grapheme, and the vertical pattern 55P may be a metal pattern such as a copper pattern.

The composite heat dissipating layer 50D may be connected to the heat dissipation pattern 132H disposed outside of the sealing member 130 via the heat dissipation via 53. As illustrated in FIG. 13, the heat dissipation via 133H may be connected to the vertical pattern 55P.

Based on FIG. 14, a semiconductor package 100E according to the present example embodiment may have the same or substantially similar structure to those illustrated in FIGS. 5 and 6, except that the composite heat dissipating layer 50E has a single layer structure. Accordingly, the descriptions of the example embodiments illustrated in FIGS. 5 and 6 can be applied to the present example embodiment, unless indicated otherwise.

The composite heat dissipating layer 50E employed in the present example embodiment has a single layer structure, but has a different shape from that 50C illustrated in FIG. 12. The composite heat dissipating layer 50E may include the first heat dissipation member 52 in the sheet form and the second heat dissipation member having a vertical pattern 55P surrounding the edge region of the first heat dissipation member 52. In other words, the composite heat dissipating layer 50E may include a heat dissipation sheet 52 having a horizontal thermal conductivity higher than a vertical thermal conductivity and vertical patterns 55P having higher a vertical thermal conductivity higher than the vertical thermal conductivity of the heat dissipation sheet 52, and surrounding the edge region of the heat dissipating layer 50E. Such vertical patterns 55P may have an arrangement as illustrated in FIG. 11B. For example, the heat dissipation sheet 52 contains at least one of graphite and grapheme, and the vertical pattern 55P may be a metal pattern such as a copper pattern.

The composite heat dissipating layer 50E may be connected to the heat dissipation pattern 132H disposed outside of the sealing member 130 via the heat dissipation via 53. As illustrated in FIG. 14, the heat dissipation via 133H may be connected to the heat dissipation sheet 52.

Figure 15:
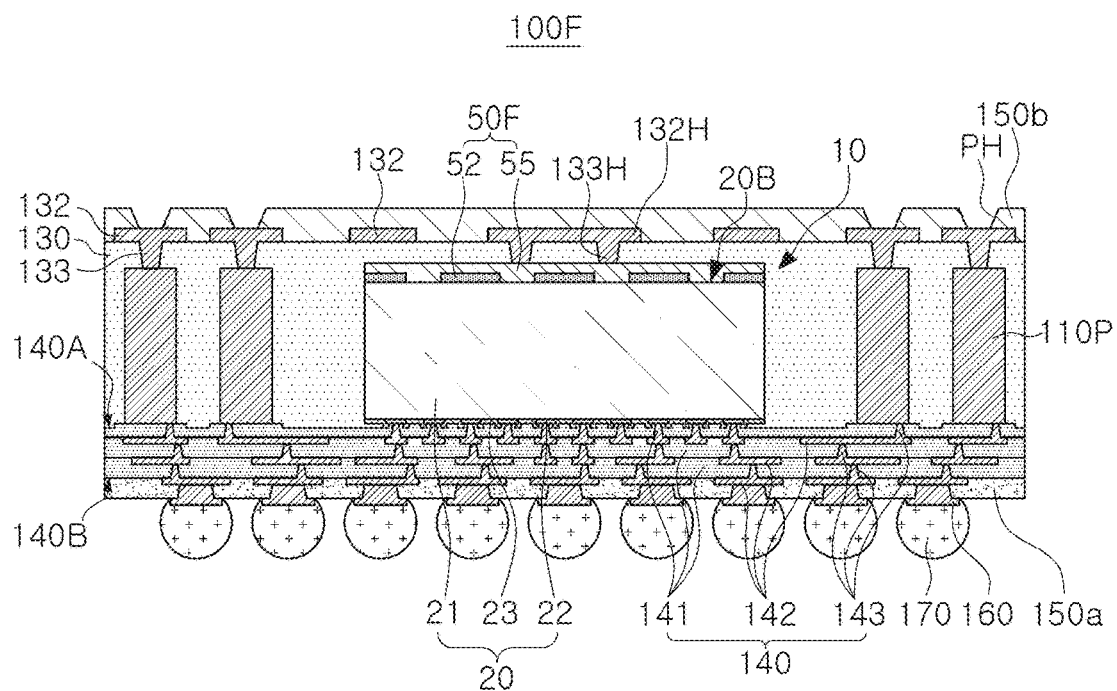

FIG. 15 is side cross-sectional views of a semiconductor package according to an example embodiment.

Based on FIG. 15, a semiconductor package 100F according to the present example embodiment may have the same or substantially similar structure to those illustrated in FIGS. 5 and 6, except that a vertical interconnection portion 110P replaces the frame (110 of FIG. 5) having the wiring structure. Accordingly, the descriptions of the example embodiments illustrated in FIGS. 5 and 6 can be applied to the present example embodiment, unless indicated otherwise.

Unlike the previous example embodiments, a semiconductor package 100F including the composite heat dissipating layer 50F according to the present example embodiment may be a wafer level package. In the semiconductor package 100F, an interconnection element connecting the backside redistribution layers 132 and 133 and the redistribution layers 142 and 143 of the package substrate 140 may be the vertical interconnection portion 110P, such as a metal post, but not the wiring structure of the frame. Such vertical interconnection portion 110P is disposed to penetrate the sealing member 130 sealing the semiconductor device 10 so as to electrically connect the backside redistribution layers 132 and 133 and the redistribution layers 142 and 143 of the package substrate. In the present example embodiment, the vertical interconnection portion 110P is directly connected to the wiring vias 133 and 143, but is not limited thereto. In other example embodiments, the vertical interconnection portion 110P may be directly connected to the wiring patterns 132 and 142.

In the present example embodiment, the heat dissipation via 133H may be connected to the second heat dissipation member 55 of the composite heat dissipating layer 50. The second heat dissipation member 55 is coupled to the semiconductor chip 20 through the vertical patterns penetrating the first heat dissipation member 52, and thus can provide a vertical heat dissipation path extending toward the outside of the sealing member 130 through the heat dissipation via 133H and the heat dissipation pattern 132H and the second heat dissipation member 55. The heat dissipation via 133H and the heat dissipation pattern 132H may be metal having a relatively high thermal conductivity, and may be formed of a material the same as that of the backside redistribution layers 132 and 133.

A method of manufacturing a semiconductor device having the previously described composite heat dissipating layer 50 may be carried out by a different method. In the previous example embodiment (FIG. 4), the first and second heat dissipation members 52 and 55 are formed of different materials, but are not limited thereto. In other example embodiments, the material of the second heat dissipation member 55 is the same as that of the first heat dissipation member 52 but has a different growth direction to provide a material having a relatively high vertical thermal conductivity. Such manufacturing method of the semiconductor device can be described with reference to FIGS. 16A to 16C.

Based on FIG. 16A, an additional mask pattern MP' may be formed on the first heat dissipation member 52.

The first heat dissipation member 52 illustrated in the present example embodiment can be understood as a product manufactured in FIG. 4D. After the mask pattern (MP of FIG. 4C) for the first heat dissipation member is removed, an additional mask pattern MP' having holes h' for forming the second heat dissipation member can be formed.

Based on FIG. 16B, the second heat dissipation member 55 may be formed in the holes h by slightly tilting the wafer W.

The second heat dissipation member 55 employed in the present example embodiment is the same as the material of the first heat dissipation member 52, but is oriented in a different orientation from that of the first heat dissipation member. In a specific example, as illustrated in FIG. 16B, the second heat dissipation member filled in the holes h' can be formed by tilting a second surface 20B of the wafer W at a certain angle θ with respect to a growth direction GD to obliquely grow the same graphite as that of the first heat dissipation member 52. Thus, the first and second heat dissipation members 52 and 55 may be formed of graphite having different orientations by an inclined angle θ. Because the graphite of the first heat dissipation member 52 maintains a layered structure parallel to the second surface 20B of the wafer, the vertical thermal conductivity of the first heat dissipation member 52 is significantly lower than the horizontal thermal conductivity of the first heat dissipation member 52. However, due to the difference in the growth direction, the second heat dissipation member 55 can have the vertical thermal conductivity higher than that of the first heat dissipation member 52.

Based on FIG. 16C, after the mask pattern MP' is removed, the wafer W, together with the composite heat dissipating layer 50', is cut into an individual chip unit to provide a semiconductor device 10' illustrated in FIG. 17.

FIG. 17 is a side cross-sectional view of a semiconductor device according to an example embodiment.

Based on FIG. 17, a semiconductor device 10F according to the present example embodiment may have the same or substantially similar structure to those illustrated in FIGS. 1 and 2, except that the semiconductor device 10F includes a different form of the composite heat dissipating layer 50'. Accordingly, the descriptions of the example embodiments illustrated in FIGS. 1 and 2 can be applied to the present example embodiment, unless indicated otherwise.

The composite heat dissipating layer 50' employed in the present example embodiment is a product manufactured by the process previously described (see FIG. 16) and may include first and second heat dissipation members 52 and 55 formed of materials (e.g., graphite) having different orientations. For example, the first heat dissipation member 52 is formed of graphite grown (or oriented) in the z direction while the second heat dissipation member 55 is formed of graphite grown by tilting a growth surface. In this case, the graphite of the second heat dissipation member 55 grows in a direction intersecting with the z direction (e.g., a direction close to x or y), and thus can have a different orientation compared to the graphite of the first heat dissipation member 52. Thus, the second heat dissipation member 55 may obtain the heat dissipation characteristics of a vertical thermal conductivity being higher than that of the first heat dissipation member 52.

As previously described, the first heat dissipation member 52 provides effective heat dissipation in the horizontal direction while being comparatively incapable of providing effective heat dissipation in the vertical direction. To enhance the heat dissipation in the vertical direction, the second heat dissipation member 55 is formed to penetrate the first heat dissipation member 52.

According to example embodiments disclosed herein, a composite heat dissipating layer having improved capability of heat dissipation by forming a vertical pattern on a heat dissipation sheet (e.g., a graphite sheet), which has relatively good heat dissipation characteristics in a horizontal direction, using a material (e.g., metal) having a relatively high vertical thermal conductivity is provided. Such a composite heat dissipating layer may be formed on a surface of a semiconductor chip by a wafer level method, and such semiconductor chips can be usefully introduced into various package structures.

Various advantages and beneficial effects of the present disclosure are not limited to the above descriptions and may be easily understood in the course of describing a specific example embodiment.

While some example embodiments have been shown and described in detail above, it will be apparent to those skilled in the art that modifications and variations could be made without departing from the scope of the present disclosure as defined by the appended claims.

What is claimed is:

1. A semiconductor device, comprising:
a semiconductor chip having a first surface and a second surface opposite to the first surface;
a first heat dissipation member on the second surface of the semiconductor chip, the first heat dissipation member having a first vertical thermal conductivity in a direction perpendicular to the second surface, and a first horizontal thermal conductivity in a direction parallel to the second surface, the first vertical thermal conductivity being smaller than the first horizontal thermal conductivity; and
a second heat dissipation member comprising a vertical pattern penetrating the first heat dissipation member, the second heat dissipation member having a second vertical thermal conductivity that is greater than the first vertical thermal conductivity of the first heat dissipation member,
wherein the vertical pattern completely surrounds the first heat dissipation member.

2. The semiconductor device of claim 1, wherein
the second heat dissipation member is on the first heat dissipation member, and
the second heat dissipation member further comprises a heat dissipating layer connected to the vertical pattern.

3. The semiconductor device of claim 2, wherein a side surface of the first heat dissipation member and a side surface of the heat dissipating layer are substantially coplanar with a side surface of the semiconductor chip.

4. The semiconductor device of claim 1, wherein the vertical pattern comprises a plurality of vertical patterns arranged in the first heat dissipation member.

5. The semiconductor device of claim 1, wherein the first heat dissipation member has a structure of a single sheet that is not separated by the vertical pattern.

6. The semiconductor device of claim 1, wherein the vertical pattern is on at least one edge of the first heat dissipation member.

7. The semiconductor device of claim 1, wherein the first heat dissipation member comprises at least one of graphite or graphene.

8. The semiconductor device of claim 1, wherein the second heat dissipation member comprises metal.

9. The semiconductor device of claim 1, wherein the first heat dissipation member comprises graphite oriented in a first direction, and the second heat dissipation member comprises graphite oriented in a second direction intersecting with the first direction.

10. A semiconductor device, comprising:
a semiconductor chip comprising a first surface on which a connection pad is disposed and a second surface opposite to the first surface; and
a composite heat dissipating layer comprising,
a graphite sheet on the second surface of the semiconductor chip, and
a plurality of metal patterns penetrating the graphite sheet,
wherein the plurality of metal patterns completely surround the graphite sheet.

11. The semiconductor device of claim 10, wherein a side surface of the composite heat dissipating layer is substantially coplanar with a side surface of the semiconductor chip.

12. The semiconductor device of claim 10, wherein the composite heat dissipating layer further comprises a heat dissipating metal layer that is on the graphite sheet and is connected to a plurality of the metal patterns.

13. A semiconductor package, comprising:
a package substrate comprising a redistribution layer;
a semiconductor chip on the package substrate, the semiconductor chip comprising a first surface and a second surface, the first surface comprising a connection pad electrically connected to the redistribution layer, and the second surface being opposite to the first surface;
a composite heat dissipating layer comprising a first heat dissipating sheet and a vertical pattern, the first heat dissipating sheet on the second surface of the semiconductor chip, the first heat dissipating sheet having a first vertical thermal conductivity in a direction perpendicular to the second surface and a first horizontal thermal conductivity in a direction parallel to the second surface, the first vertical thermal conductivity being smaller than the first horizontal thermal conductivity, the vertical pattern penetrating the first heat dissipation sheet and the vertical pattern having a second vertical thermal conductivity that is greater than the first vertical thermal conductivity of the first heat dissipation sheet;

a sealing member on the package substrate and covering the semiconductor chip;

a heat dissipation pattern on the sealing member; and a heat dissipation via penetrating the sealing member to connect the heat dissipation pattern to the composite heat dissipating layer.

14. The semiconductor package of claim 13, wherein the semiconductor chip is on the package substrate such that the first surface faces the package substrate.

15. The semiconductor package of claim 13, wherein the heat dissipation via is connected to the vertical pattern of the composite heat dissipating layer.

16. The semiconductor package of claim 13, wherein
the composite heat dissipating layer further comprises a second heat dissipation sheet on the first heat dissipation sheet, the second heat dissipation sheet comprising a same metal as the vertical pattern and connected to the vertical pattern, and
the heat dissipation via is connected to the second heat dissipation sheet.

17. The semiconductor package of claim 13, further comprising:
a vertical interconnection portion electrically connected to the redistribution layer and penetrating the sealing member; and
a wiring pattern on the sealing member and electrically connected to the vertical interconnection portion.

18. The semiconductor package of claim 13, further comprising:
a frame on the package substrate, the frame comprising a cavity configured to receive the semiconductor chip,
wherein the sealing member covers an upper surface of the frame.

\* \* \* \* \*